United States Patent

Tsuchiya et al.

(10) Patent No.: US 10,944,016 B2
(45) Date of Patent: Mar. 9, 2021

(54) OPTICAL DETECTION UNIT, OPTICAL DETECTION DEVICE, AND METHOD FOR MANUFACTURING OPTICAL DETECTION UNIT

(71) Applicant: HAMAMATSU PHOTONICS K.K., Hamamatsu (JP)

(72) Inventors: Ryutaro Tsuchiya, Hamamatsu (JP); Terumasa Nagano, Hamamatsu (JP); Yuta Tsuji, Hamamatsu (JP); Go Kawai, Hamamatsu (JP); Yuki Okuwa, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/308,116

(22) PCT Filed: May 30, 2017

(86) PCT No.: PCT/JP2017/020112
§ 371 (c)(1),
(2) Date: Dec. 7, 2018

(87) PCT Pub. No.: WO2017/212986
PCT Pub. Date: Dec. 14, 2017

(65) Prior Publication Data
US 2019/0181275 A1  Jun. 13, 2019

(30) Foreign Application Priority Data

Jun. 8, 2016 (JP) .............................. JP2016-114519

(51) Int. Cl.
*H01L 31/0216* (2014.01)
*G01J 1/42* (2006.01)
(Continued)

(52) U.S. Cl.
CPC .......... *H01L 31/02164* (2013.01); *G01J 1/02* (2013.01); *G01J 1/0437* (2013.01);
(Continued)

(58) Field of Classification Search
CPC ......... H01L 31/02327; H01L 31/02164; H01L 2924/1204; H01L 25/167; H01L 27/146; H01L 24/82
See application file for complete search history.

(56) References Cited

U.S. PATENT DOCUMENTS 5,793,047 A  8/1998 Kobayashi et al.
6,828,545 B1  12/2004 Hamilton, Jr. et al.
(Continued)

FOREIGN PATENT DOCUMENTS

CN  1312474 A  9/2001
CN  1992314 A  7/2007
(Continued)

OTHER PUBLICATIONS

International Preliminary Report on Patentability dated Dec. 20, 2018 for PCT/JP2017/020112.

*Primary Examiner* — Hsien Ming Lee
(74) *Attorney, Agent, or Firm* — Faegre Drinker Biddle & Reath LLP

(57) ABSTRACT

An optical detection unit includes a first wiring substrate that has a first main surface, a plurality of optical detection chips that each have a light receiving surface and a rear surface on a side opposite to the light receiving surface and are two-dimensionally arranged on the first main surface, a first bump electrode that electrically connects the optical detection chip to the first wiring substrate, a light transmitting portion that is provided on the light receiving surface, and a light shielding portion that has light reflection properties or light absorption properties. The optical detection chip (Continued)

includes a Geiger-mode APD and is mounted on the first wiring substrate by the first bump electrode in a state in which the rear surface faces the first main surface.

8 Claims, 20 Drawing Sheets

(51) Int. Cl.
    *G01J 1/02*     (2006.01)
    *H01L 27/146*     (2006.01)
    *G01J 1/04*     (2006.01)
    *G01J 1/44*     (2006.01)
    *H01L 23/00*     (2006.01)
    *H01L 25/04*     (2014.01)
    *H01L 31/02*     (2006.01)
    *H01L 31/0203*     (2014.01)
    *H01L 31/107*     (2006.01)
    *H01L 25/16*     (2006.01)
    *H01L 31/0232*     (2014.01)

(52) U.S. Cl.
    CPC . *G01J 1/42* (2013.01); *G01J 1/44* (2013.01); *H01L 24/16* (2013.01); *H01L 24/81* (2013.01); *H01L 25/042* (2013.01); *H01L 27/146* (2013.01); *H01L 31/0203* (2013.01); *H01L 31/02005* (2013.01); *H01L 31/02019* (2013.01); *H01L 31/107* (2013.01); *G01J 2001/4466* (2013.01); *H01L 25/167* (2013.01); *H01L 31/02322* (2013.01); *H01L 2224/16227* (2013.01); *H01L 2224/81815* (2013.01); *H01L 2924/12043* (2013.01)

(56) References Cited

U.S. PATENT DOCUMENTS

| | | | |
|---|---|---|---|
| 2009/0108181 A1 | 4/2009 | Ishihara et al. | |
| 2015/0108358 A1 | 4/2015 | Sasaki et al. | |
| 2015/0380457 A1* | 12/2015 | Fujii | G01T 1/241 |
| | | | 378/19 |
| 2016/0380020 A1 | 12/2016 | Hosono et al. | |

FOREIGN PATENT DOCUMENTS

| | | |
|---|---|---|
| CN | 104051476 A | 9/2014 |
| CN | 105009289 A | 10/2015 |
| JP | S64-13767 A | 1/1989 |
| JP | H01-240887 A | 9/1989 |
| JP | H09-298287 A | 11/1997 |
| JP | H10-10235 A | 1/1998 |
| JP | 2001-221863 A | 8/2001 |
| JP | 2006-49512 A | 2/2006 |
| JP | 2009-111089 A | 5/2009 |
| JP | 20113739 A | 1/2011 |
| JP | 2014-160042 A | 9/2014 |
| JP | 2015-081863 A | 4/2015 |
| TW | 390032 B | 5/2000 |
| TW | 201448183 A | 12/2014 |
| WO | WO-2008/004547 A1 | 1/2008 |
| WO | WO 2015/141045 A1 | 9/2015 |

* cited by examiner

Fig.20
(a)
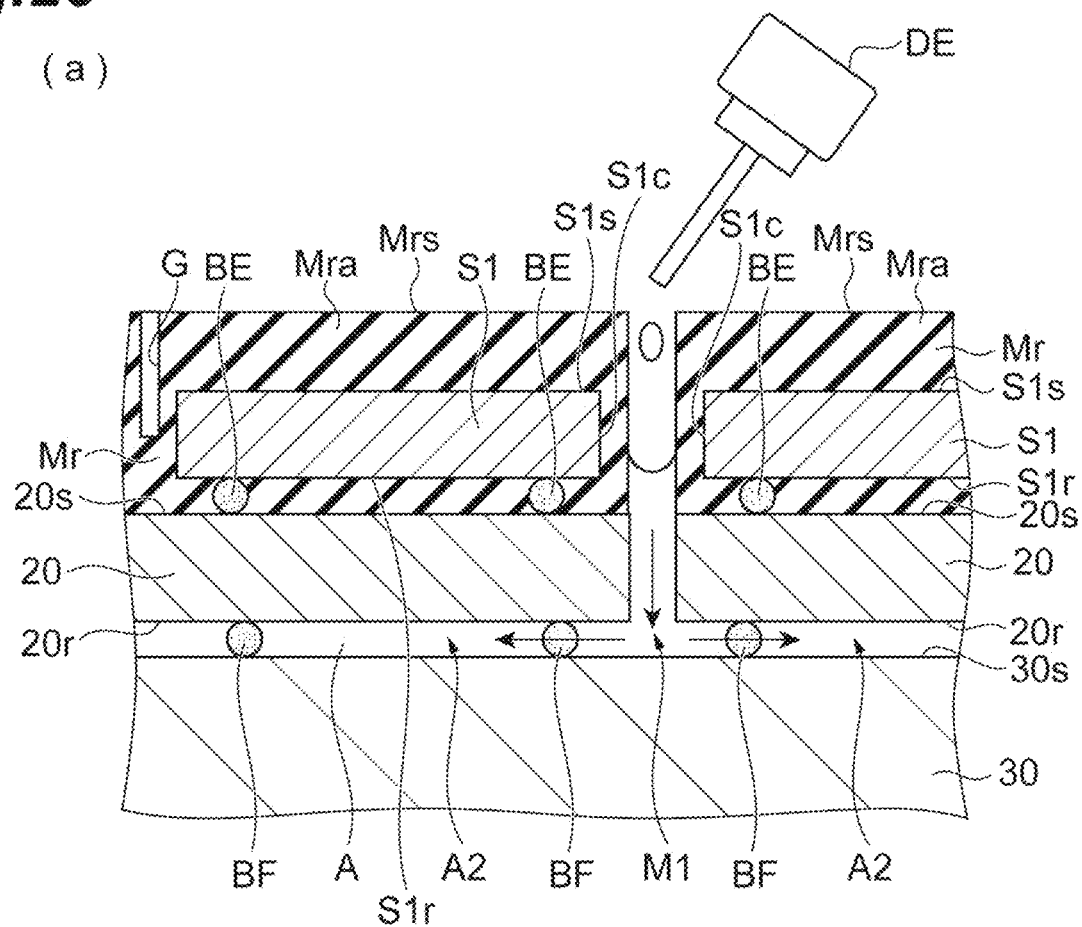
(b)
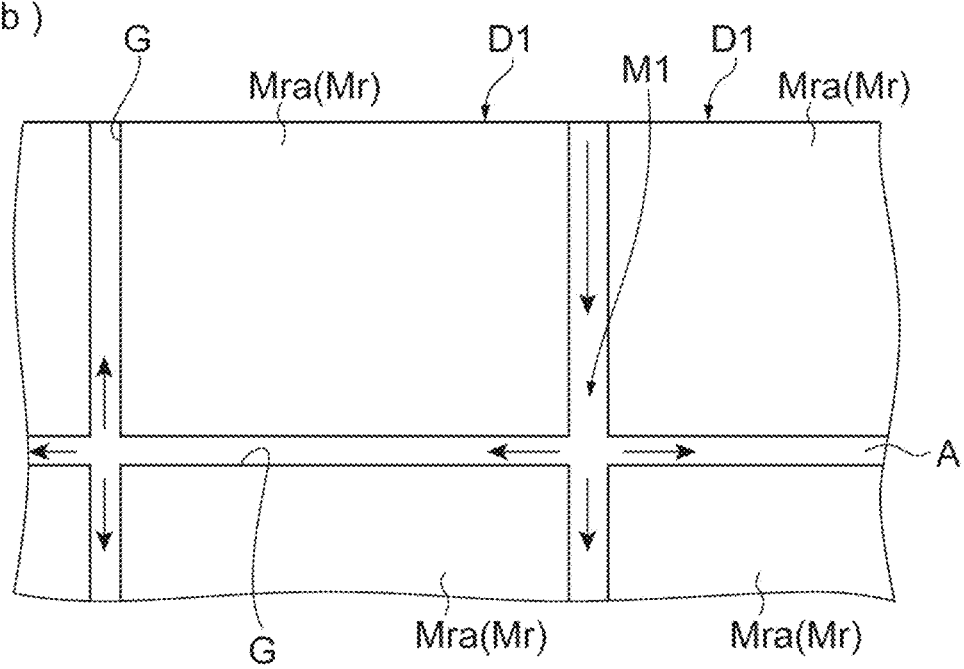

OPTICAL DETECTION UNIT, OPTICAL DETECTION DEVICE, AND METHOD FOR MANUFACTURING OPTICAL DETECTION UNIT

TECHNICAL FIELD

An aspect of the present invention relates to an optical detection unit, an optical detection element, and a method for manufacturing an optical detection unit.

BACKGROUND ART

Patent Literature 1 discloses an optical detection device. This optical detection device includes a plurality of light receiving elements which each output an electric signal corresponding to a quantity of incident light, a signal processing element which is disposed to face the plurality of light receiving elements and to which an electric signal output from the plurality of light receiving elements is input, a resin which fills clearances between the plurality of light receiving elements and the signal processing element, and a light shielding member which is disposed to cover a surface of the resin exposed from the plurality of light receiving elements and the signal processing element.

CITATION LIST

Patent Literature

Patent Literature 1: Japanese Unexamined Patent Publication No. 2009-111089
Patent Literature 2: Japanese Unexamined Patent Publication No. 2011-003739

SUMMARY OF INVENTION

Technical Problem

In an optical detection device disclosed in Patent Literature 1, a light shielding member is disposed to cover a surface exposed from a plurality of light receiving elements and a signal processing element of a resin which fills a clearance between the light receiving elements and the signal processing element. In this manner, light incident through a surface of the resin exposed from the light receiving elements and the signal processing element is minimized, and stray light is prevented from being generated.

Incidentally, a photodiode array including a plurality of avalanche photodiodes that operate in a Geiger mode (Geiger-mode APDs), and a quenching resistor that is connected to each of the avalanche photodiodes in series is known (for example, refer to Patent Literature 2). In this photodiode array, when the avalanche photodiodes constituting pixels detect photons and perform a Geiger discharge, a pulse signal is obtained due to an operation of the quenching resistor connected to the avalanche photodiode. Each of the avalanche photodiodes counts photons.

Here, the inventor has acquired knowledge that, in a process in which development and evaluation of a large-area SiPM chip array are carried out by two-dimensionally arranging (tiling) silicon photomultiplier (SiPM) chips configured to have such Geiger-mode APDs in array, there is a problem in that crosstalk between SiPM chips affects an output of each of the SiPM chips even though the SiPM chips are arranged away from each other. The inventor has found this problem by investigating a configuration in which SiPM chips having extremely high light sensitivity are two-dimensionally arranged, as described above.

An aspect of the present invention has been made based on such circumstances, and an object thereof is to provide an optical detection unit, in which crosstalk between chips including a Geiger-mode APD can be minimized, an optical detection device, and a method for manufacturing an optical detection unit.

Solution to Problem

The inventor has repeated further investigations to solve the problem described above. As a result, the inventor has acquired the following knowledge. That is, as an example, a glass member may be provided on light receiving surfaces of SiPM chips. In addition, as another example, a plurality of SiPM chips may be integrally sealed by a mold resin having optical transparency. In both cases, a light transmitting portion is formed on the light receiving surface of the SiPM chip, so that detection target light arrives at the light receiving surface via the light transmitting portion. Therefore, there are cases in which stray light of detection target light incident on the light transmitting portion on the light receiving surface of one SiPM chip may be incident on the light transmitting portion on the light receiving surface or the light receiving surface of another SiPM chip adjacent thereto, and this may cause crosstalk between SiPM chips. The inventor has completed an aspect of the present invention based on the knowledge described above.

According to an aspect of the present invention, there is provided an optical detection unit including a first wiring substrate that has a first main surface, a plurality of optical detection chips that each have a light receiving surface and a rear surface on a side opposite to the light receiving surface and are two-dimensionally arranged on the first main surface, a first bump electrode that electrically connects the optical detection chip to the first wiring substrate, a light transmitting portion that is provided on the light receiving surface, and a light shielding portion that has light reflection properties or light absorption properties. The optical detection chip includes a Geiger-mode APD and is mounted on the first wiring substrate by the first bump electrode in a state in which the rear surface faces the first main surface. The light shielding portion is provided at least on the light transmitting portion side of the light receiving surface in an intermediate region positioned between the optical detection chips adjacent to each other when seen in a first direction intersecting the first main surface.

In this optical detection unit, the optical detection chips including the Geiger-mode APD (avalanche photodiode which operates in a Geiger mode) are two-dimensionally arranged on the first main surface of the first wiring substrate and are mounted (tiled) by the first bump electrode. The light transmitting portion is provided on the light receiving surface of the optical detection chip. Then, the light shielding portion is provided in the intermediate region between optical detection chips adjacent to each other at least on the light transmitting portion side of the light receiving surface of the optical detection chip. Therefore, stray light incident on the light transmitting portion on the light receiving surface or the light receiving surface of one optical detection chip from the light transmitting portion on the light receiving surface of another optical detection chip is minimized. Therefore, crosstalk between chips including the Geiger-mode APD can be minimized.

In the optical detection unit according to the aspect of the present invention, the light transmitting portion may include a light incidence surface on a side opposite to a surface on the light receiving surface side. An end portion of the light shielding portion on the light incidence surface side may be positioned on the first main surface side of the light incidence surface in the first direction and may be recessed toward the first main surface side. In this case, the light shielding portion can avoid overlapping the light receiving surface when seen in the first direction. In addition, when an adhesive such as a resin is disposed on the light transmitting portion, a surplus adhesive can escape due to a recess at the end portion of the light shielding portion.

In the optical detection unit according to the aspect of the present invention, the light transmitting portion may be a glass member attached to the light receiving surface of each of the optical detection chips. The light shielding portion may be integrally provided over the intermediate region, and a first lower region between the first main surface and the rear surface. In this case, for example, the light shielding portion can be collectively constituted by filling the intermediate region and the first lower region with an underfill resin having light reflection properties or light absorption properties.

In the optical detection unit according to the aspect of the present invention, the light transmitting portion may be a part of a resin portion integrally sealing the plurality of optical detection chips. A groove portion positioned in the intermediate region may be provided in the resin portion. The light shielding portion may be disposed inside the groove portion. When the light transmitting portion is constituted by collectively sealing the plurality of optical detection chips with the resin portion in this manner, the groove portion may be formed in this resin portion and the light shielding portion may be disposed inside the groove portion.

According to another aspect of the present invention, there is provided an optical detection device including the plurality of optical detection units described above, a second wiring substrate that has a second main surface, and a second bump electrode that electrically connects the optical detection units to the second wiring substrate. The optical detection units are arranged along the second main surface and are mounted on the second wiring substrate by the second bump electrode in a state in which a bottom surface on a side opposite to the first main surface of the first wiring substrate faces the second main surface. The light shielding portion is integrally provided over the intermediate region, a first lower region between the first main surface and the rear surface, and a second lower region between the second main surface and the bottom surface.

According to another aspect of the present invention, there is provided an optical detection device including the plurality of optical detection units described above, a second wiring substrate that has a second main surface, and a second bump electrode that electrically connects the optical detection units to the second wiring substrate. The optical detection units are arranged along the second main surface and are mounted on the second wiring substrate by the second bump electrode in a state in which a bottom surface on a side opposite to the first main surface of the first wiring substrate faces the second main surface. The light shielding portion is further provided at least on the light transmitting portion side of the light receiving surface in the intermediate region between the optical detection units adjacent to each other.

These optical detection devices include the optical detection unit described above. Therefore, crosstalk between chips including the Geiger-mode APD can be minimized. In addition, crosstalk between chips is also minimized between optical detection units adjacent to each other.

According to another aspect of the present invention, there is provided a method for manufacturing an optical detection unit. The method includes a first step of preparing a first wiring substrate having a first main surface, and a plurality of optical detection chips having a light receiving surface and a rear surface on a side opposite to the light receiving surface; a second step of disposing the plurality of optical detection chips on the first main surface such that the rear surfaces face the first main surface and are two-dimensionally arranged on the first main surface while a first bump electrode is interposed between the rear surface and the first main surface; a third step of mounting the plurality of optical detection chips on the first main surface by a reflow of the first bump electrode; and a fourth step of filling an intermediate region positioned between the optical detection chips adjacent to each other when seen in a first direction intersecting the first main surface, and a first lower region between the first main surface and the rear surface, with an underfill resin. The optical detection chip includes a Geiger-mode APD. A light transmitting portion is provided on the light receiving surface of each of the optical detection chips. The underfill resin has light reflection properties or light absorption properties. In the fourth step, a light shielding portion is constituted by filling the intermediate region with the underfill resin at least to the light transmitting portion side of the light receiving surface.

In this method, after the optical detection chip including the Geiger-mode APD is mounted on the first main surface of the first wiring substrate, the intermediate region and the first lower region are filled with an underfill resin having light reflection properties or optical transparency. At this time, the light shielding portion is constituted by filling the intermediate region with the underfill resin at least to the light transmitting portion side of the light receiving surface. Therefore, in a manufactured optical detection unit, stray light incident on the light transmitting portion on the light receiving surface or the light receiving surface of one optical detection chip from the light transmitting portion on the light receiving surface of another optical detection chip is minimized. That is, according to this method, it is possible to manufacture an optical detection unit in which crosstalk between chips including a Geiger-mode APD can be minimized.

According to another aspect of the present invention, there is provided a method for manufacturing an optical detection unit. The method includes a first step of preparing a first wiring substrate having a first main surface, and a plurality of optical detection chips having a light receiving surface and a rear surface on a side opposite to the light receiving surface; a second step of disposing the plurality of optical detection chips on the first main surface such that the rear surfaces face the first main surface and are two-dimensionally arranged on the first main surface while a first bump electrode is interposed between the rear surface and the first main surface; a third step of mounting the plurality of optical detection chips on the first main surface by a reflow of the first bump electrode; a fourth step of constituting a resin portion which integrally seals the plurality of optical detection chips with a mold resin having optical transparency to constitute a light transmitting portion which is a part of the resin portion over a plurality of light receiving surfaces; a fifth step of forming a groove portion in the resin portion to be positioned in an intermediate region positioned between the optical detection chips adjacent to each other when seen in a first direction intersecting the first main surface; and a sixth step of constituting a light shielding portion by filling, an inside of the groove portion with a resin having light reflection properties or light absorption properties. The optical detection chip includes a Geiger-mode APD. In the fifth step, the groove portion is formed at least on the light transmitting portion side of the light receiving surface in the intermediate region.

In this method, after the optical detection chip including the Geiger-mode APD is mounted on the first main surface of the first wiring substrate, the light transmitting portion is constituted over the plurality of light receiving surfaces by integrally sealing the plurality of optical detection chips with a mold resin having optical transparency. Thereafter, the groove portion is formed to be positioned in the intermediate region. At this time, the groove portion is formed at least on the light transmitting portion side of the light receiving surface in the intermediate region. Then, the light shielding portion is constituted by filling the inside of the groove portion with a resin having light reflection properties or light absorption properties. Therefore, in a manufactured optical detection unit, stray light incident on the light transmitting portion on the light receiving surface or the light receiving surface of one optical detection chip from the light transmitting portion on the light receiving surface of another optical detection chip is minimized. That is, according to this method, it is possible to manufacture an optical detection unit in which crosstalk between chips including a Geiger-mode APD can be minimized.

Advantageous Effects of Invention

According to the aspect of the present invention, it is possible to provide the optical detection unit, in which crosstalk between chips including a Geiger-mode APD can be minimized, the optical detection device, and the method for manufacturing an optical detection unit.

BRIEF DESCRIPTION OF DRAWINGS

FIG. 20 is a view illustrating a state of an underfill resin being filled.

DESCRIPTION OF EMBODIMENT

Hereinafter, an embodiment according to an aspect of the present invention will be described in detail with reference to the drawings. In each of the diagrams, the same reference signs are applied to the same or corresponding elements, and there are cases in which duplicated description is omitted.

Figure 1:
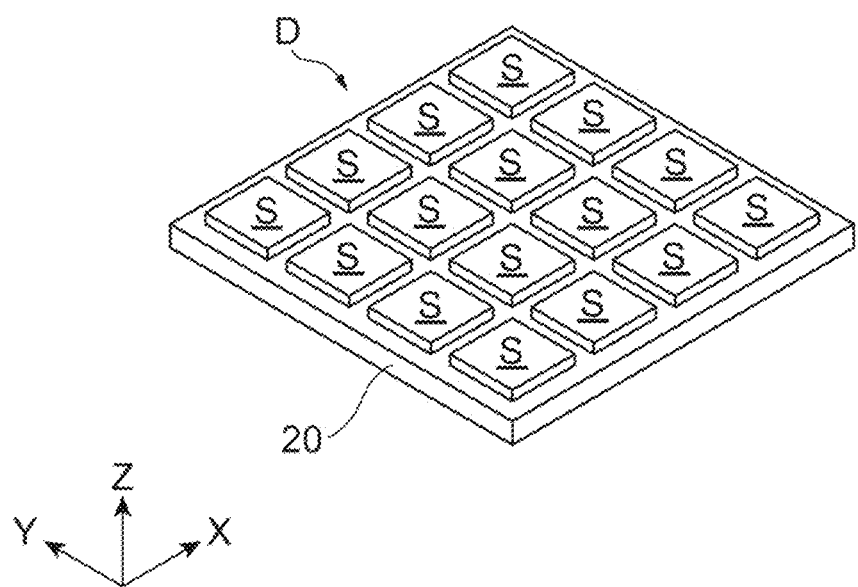
FIG. 1 is a perspective view of an optical detection unit according to the present embodiment.

FIG. 1 is a perspective view of an optical detection unit according to the present embodiment. As illustrated in FIG. 1, an optical detection unit D includes a first wiring substrate 20 and a plurality of detection chips S. The first wiring substrate 20 has a first main surface 20s. The detection chips S are two-dimensionally arranged on the first main surface 20s. A bump electrode is interposed between each of the detection chips S and the first wiring substrate 20. Here, the detection chips S are disposed in array of 4×4. However, the number of detection chips S is not limited thereto. In addition, in FIG. 1, an XYZ three-dimensional orthogonal coordinate system is illustrated. However, radiation rays, such as γ-rays or X-rays, travel in the negative direction of a Z-axis and are incident on the detection chips S. An output signal from the detection chips S is input to the first wiring substrate 20 via the bump electrode.

Figure 2:
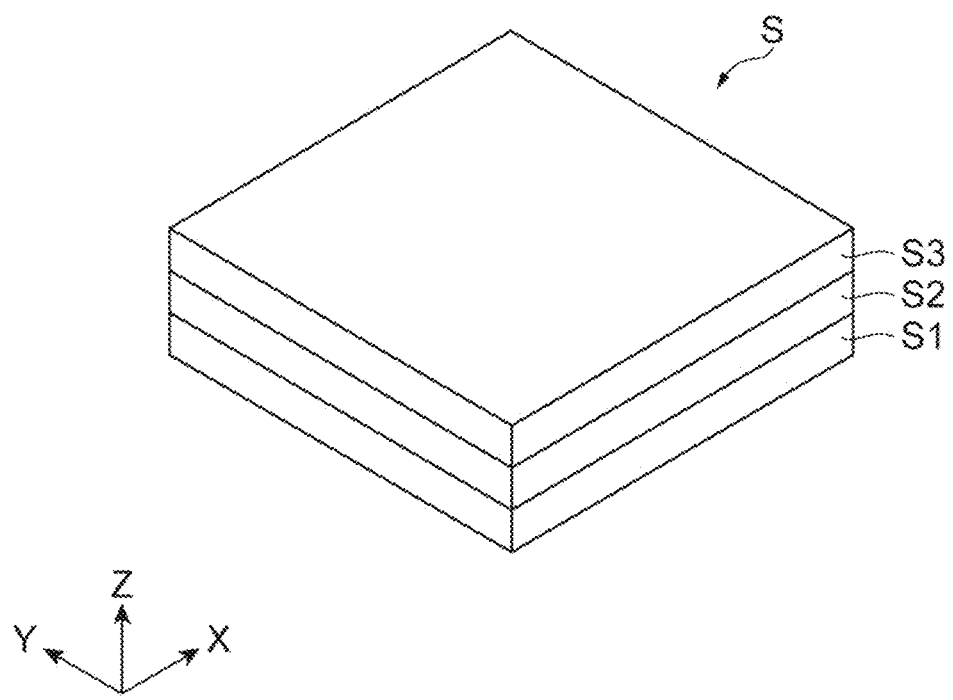
FIG. 2 is a perspective view illustrating a detection chip illustrated in FIG. 1.

FIG. 2 is a perspective view illustrating the detection chip illustrated in FIG. 1. As illustrated in FIG. 2, the detection chip S includes an optical detection chip S1 including a semiconductor region, a plate-shaped glass member S2 provided on the optical detection chip S1, and a scintillator S3 provided on the optical detection chip S1 and the glass member S2. A bonding layer is interposed between the optical detection chip S1 and the glass member S2, and between the glass member S2 and the scintillator S3.

For example, the bonding layer is formed of a resin, such as EPO-TEK301 (trademark) manufactured by EPOXY TECHNOLOGY INC. The scintillator S3 contains at least one selected from the group consisting of $Lu_{2-x}Y_xSiO_5$: Ce(LYSO), gadolinium aluminum gallium garnet (GAGG), and NaI (Tl); and Pr: LuAG, $LaBr_2$, $LaBr_3$, and $(Lu_xTb_{1-x-y}Ce_y)_3Al_5O_{12}$ (that is, LuTAG), or a mixed material of two or more of these. The composition ratio "x" of Lu in LuTAG is within a range of 0.5 to 1.5, and the composition ratio "y" of Ce is within a range of 0.01 to 0.15. Radiation rays incident on the scintillator S3 are converted into fluorescent light by the scintillator S3 and are incident on the optical detection chip S1 via the glass member S2.

Figure 3:
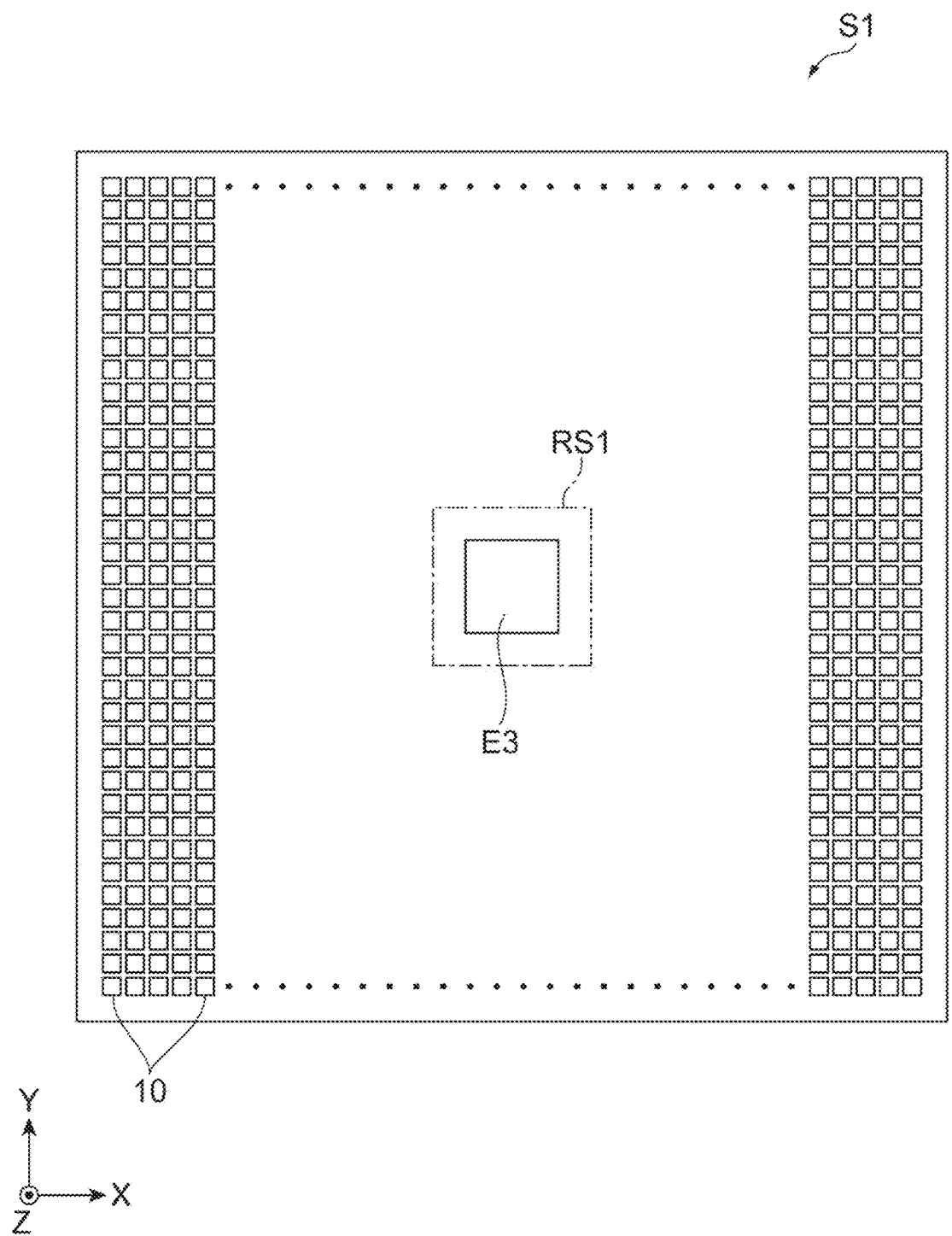
FIG. 3 is a plan view of an optical detection chip illustrated in FIG. 2.

FIG. 3 is a plan view of the optical detection chip illustrated in FIG. 2. As illustrated in FIG. 3, the optical detection chip S1 has a light receiving surface S1s, and a rear surface S1r (refer to FIG. 9) on a side opposite to the light receiving surface S1s. The glass member S2 is attached (bonded) to the light receiving surface S1s. The optical detection chip S1 includes a plurality of optical detection portions 10 two-dimensionally (here, along an X-axis and a Y-axis) arranged on the light receiving surface S1s. In addition, in a middle part of the optical detection chip S1, a common electrode E3 collecting signals from each of the optical detection portions 10 is disposed. The optical detection portions 10 are formed over the entire surface of the light receiving surface S1s. However, here, in order to clearly show the common electrode E3, only the optical detection portions 10 around an edge part are illustrated. In addition, the position for the common electrode E3 to be disposed is not limited to the middle of the optical detection chip S1.

Figure 4:
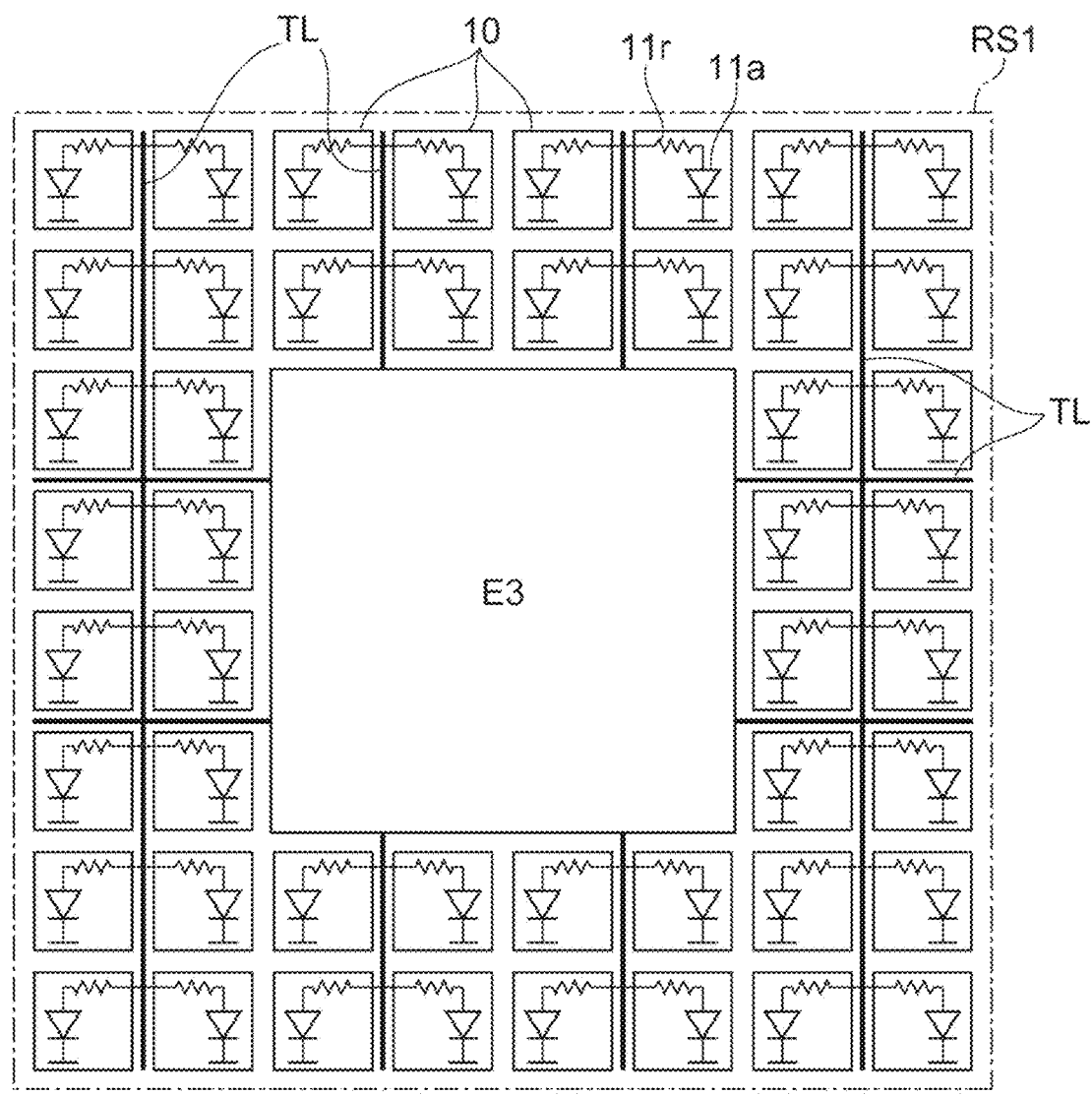
FIG. 4 is an enlarged view of a region RS1 illustrated in FIG. 3.

FIG. 4 is an enlarged view of a region RS1 illustrated in FIG. 3. As illustrated in FIG. 4, the optical detection portion 10 includes an avalanche photodiode (APD) 11a and a quenching resistor 11r. The quenching resistor 11r is connected to one end (anode) of the APD 11a. The quenching resistor 11r is connected to the common electrode E3 via a reading wiring TL. That is, all of the APDs 11a in the plurality of optical detection portions 10 are connected to the common electrode E3 via the quenching resistor 11r and the reading wiring TL thereof.

Figure 5:
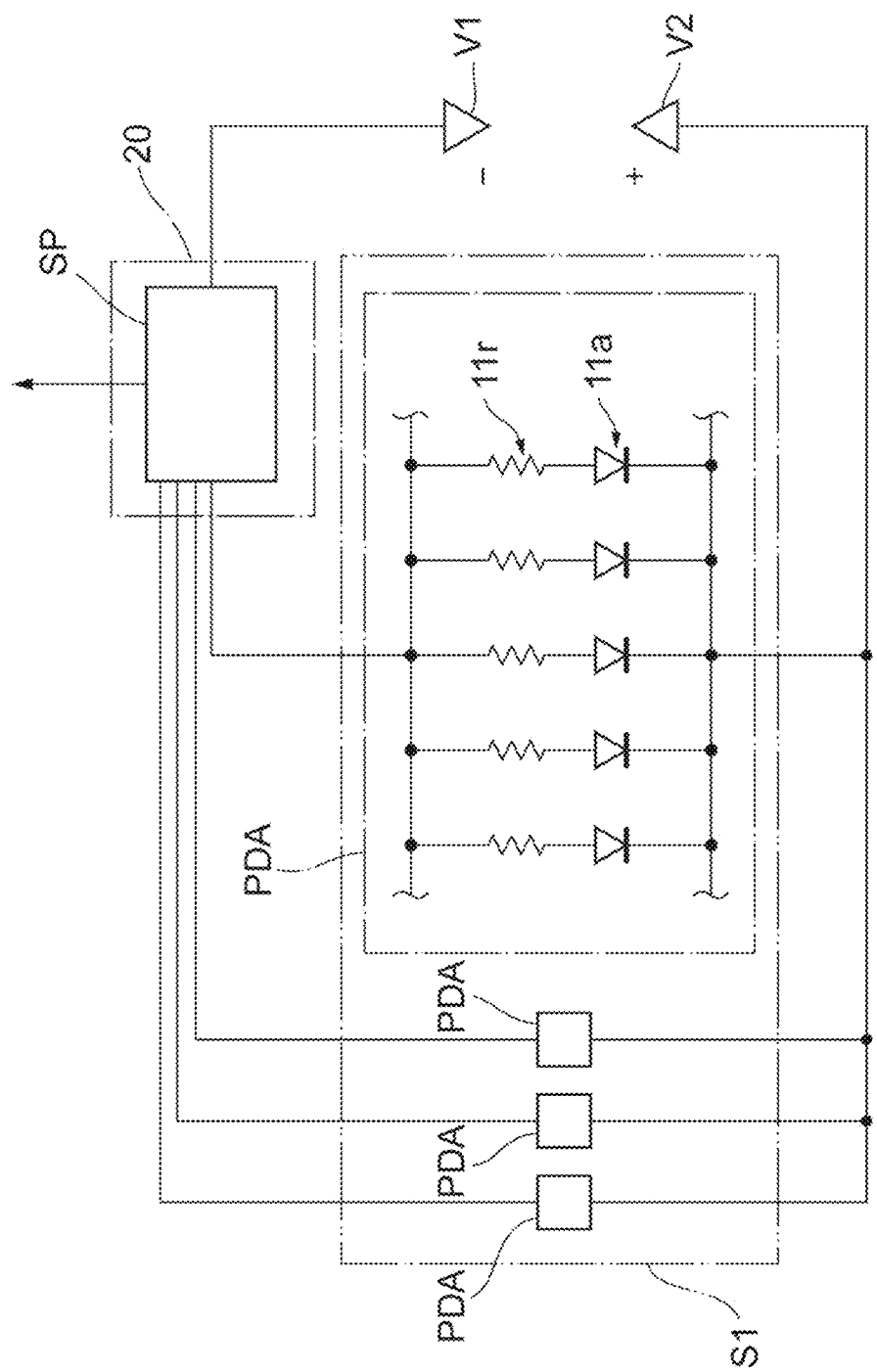
FIG. 5 is a circuit diagram of the optical detection unit illustrated in FIG. 1.

FIG. 5 is a circuit diagram of the optical detection unit illustrated in FIG. 1. As illustrated in FIG. 5, the optical detection chip S1 includes one or a plurality of photodiode arrays PDA. The photodiode array PDA is constituted of a plurality of optical detection portions 10 (the APDs 11a and the quenching resistors 11r). In the photodiode array PDA, each of the APDs 11a operates in a Geiger mode. That is, the optical detection chip S1 includes a Geiger-mode APD.

In the Geiger mode, a reverse voltage (reverse bias voltage) higher than a breakdown voltage of the APD 11a is applied to a spot between the anode and the cathode of the APD 11a. That is, a negative electric potential V1 is applied to the anode and a positive electric potential V2 is applied to the cathode. The polarities of these electric potentials are relative to each other, and one electric potential can be a ground potential.

A signal processing portion SP processing signals from the photodiode arrays PDA may be provided in the first wiring substrate 20. The signal processing portion SP constitutes an application specific integrated circuit (ASIC). The signal processing portion SP can include a CMOS circuit converting output signals from the photodiode arrays PDA (channels) into digital pulses.

Figure 6:
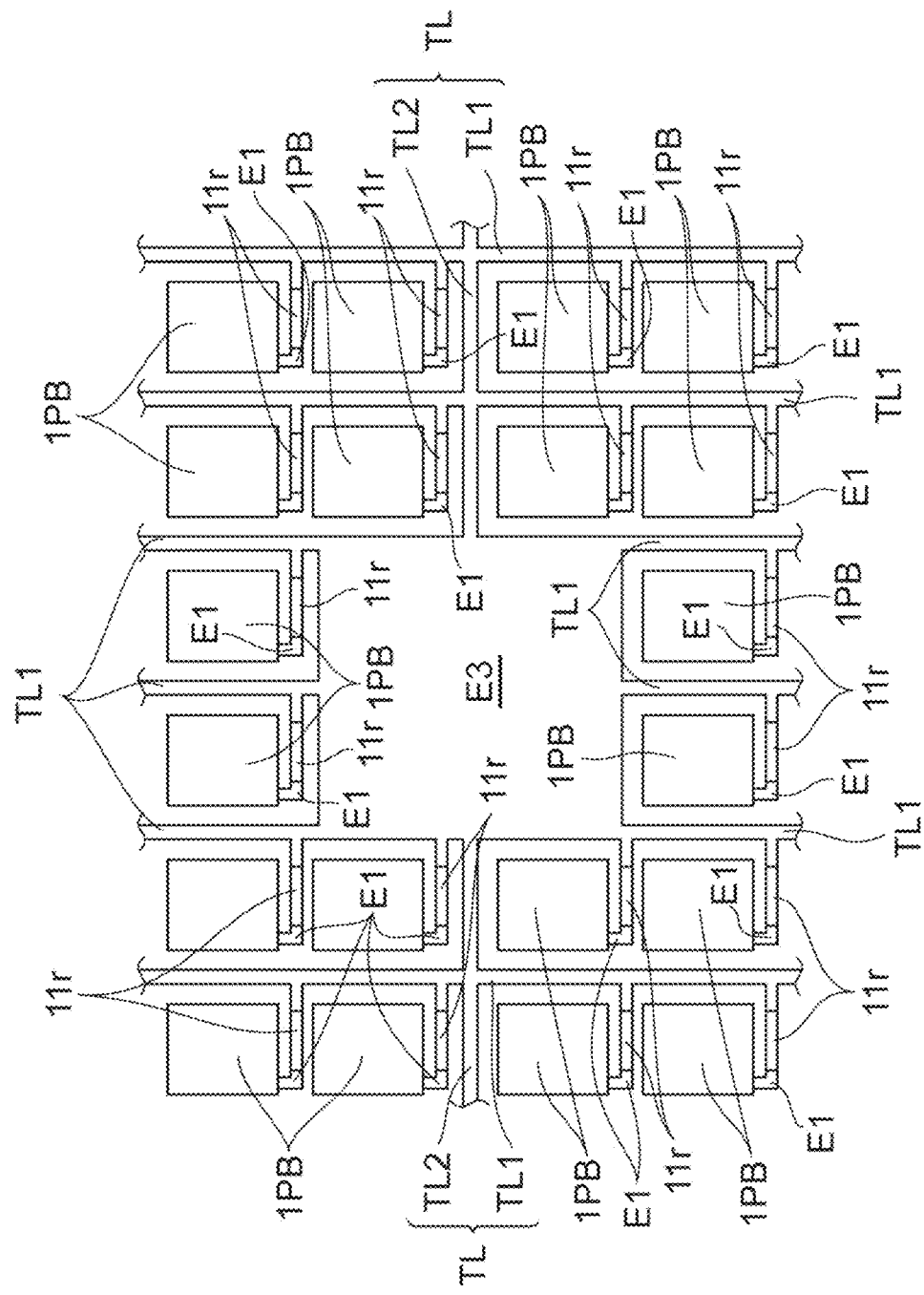
FIG. 6 is a plan view of an optical detection portion in a peripheral part of a common electrode illustrated in FIG. 3.
Figure 7:
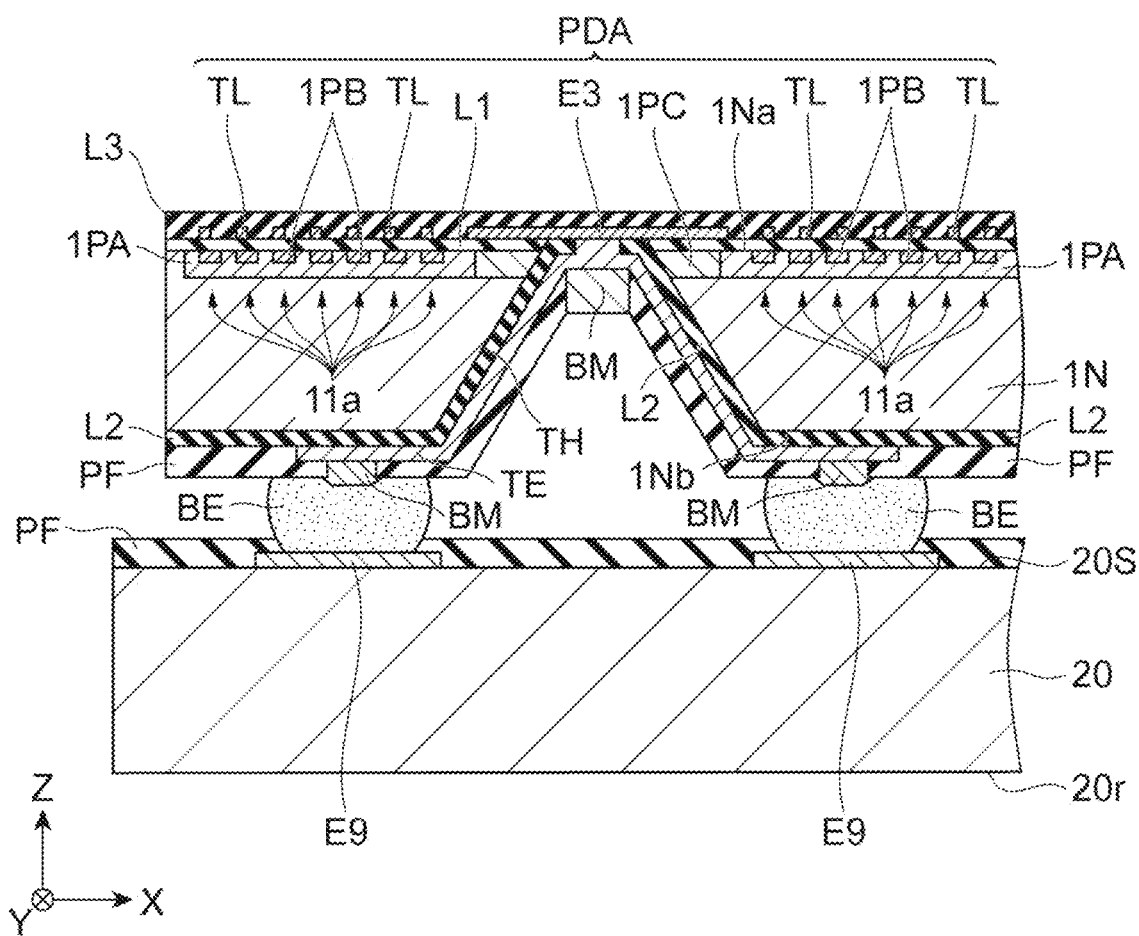
FIG. 7 is a cross-sectional view of a peripheral part of the common electrode illustrated in FIG. 3.

FIG. 6 is a plan view of the optical detection portions in a peripheral part of the common electrode illustrated in FIG. 3. FIG. 7 is a cross-sectional view of a peripheral part of the common electrode illustrated in FIG. 3. In FIG. 7, the glass member S2 and the scintillator S3 are omitted. As illustrated in FIGS. 6 and 7, the APD 11a has an electrode E1 individually disposed on a main surface 1Na side of a semiconductor substrate 1N. The electrode E1 is electrically connected to a second semiconductor region 1PB. A first semiconductor region 1PA positioned immediately below the second semiconductor region 1PB is electrically connected to the electrode E1 via the second semiconductor region 1PB.

A reading wiring (signal line) TL and the common electrode E3 are formed on the semiconductor substrate 1N outside the second semiconductor region 1PB via an insulating layer L1. The common electrode E3 is positioned in a middle region of each of the channels (photodiode arrays PDA).

The reading wiring TL includes a plurality of signal lines TL1 and a plurality of signal lines TL2. Each of the signal lines TL1 extends in a Y-axis direction in a plan view between adjacent APDs 11a. Each of the reading wirings TL2 extends in an X-axis direction between adjacent APDs 11a and electrically connects the plurality of reading wirings TL1 to each other. The reading wirings TL2 are connected to the common electrode E3. The reading wirings TL1 are electrically connected to the common electrode E3 via the reading wirings TL2 excluding those directly connected to the common electrode E3.

For each of the APDs 11a, the photodiode array PDA has a quenching resistor R1 formed via the insulating layer L1 on the semiconductor substrate 1N outside the second semiconductor region 1PB. That is, the quenching resistor R1 is disposed on the main surface 1Na side of the semiconductor substrate 1N. In the quenching resistor R1, one end thereof is connected to the electrode E1, and the other end thereof is connected to the reading wiring TL1. The semiconductor substrate 1N includes the main surface 1Na and a main surface 1Nb facing each other. The semiconductor substrate 1N is formed of Si.

Each of the photodiode arrays PDA includes a plurality of APDs 11a formed on the semiconductor substrate 1N. The anode of the APD 11a is a P-type (second conductive-type) semiconductor region 1PA (1PB), and the cathode is an N-type (first conductive-type) semiconductor substrate 1N. When photons are incident on the APD 11a, the photons are subjected to photoelectric conversion inside the substrate, and thus photoelectrons are generated. Avalanche multiplication is conducted in a region near a pn-joining interface of the first semiconductor region 1PA, and amplified electron swarms flow toward the electrodes formed in the main surface 1Nb of the semiconductor substrate 1N. That is, when photons are incident on some cell (APD 11a) in the photodiode array PDA, the photons are multiplied and are taken out from the common electrode E3 (penetration electrode TE) as a signal.

The quenching resistor R1 is connected to each of the APDs 11a in series. One APD 11a constitutes one cell in each of the photodiode arrays PDA. All of the APDs are connected to each other in parallel in a formed of being individually connected to the quenching resistor R1 in series, and a reverse bias voltage is applied thereto from a power source.

Each of the APDs 11a has the P-type first semiconductor region 1PA and the P-type second semiconductor region 1PB. The first semiconductor region 1PA is formed on the main surface 1Na side of the semiconductor substrate 1N. The second semiconductor region 1PB is formed inside the first semiconductor region 1PA and has an impurity concentration higher than that of the first semiconductor region 1PA. For example, the second semiconductor region 1PB has a polygonal plane shape (in the present embodiment, a quadrangular shape). The first semiconductor region 1PA has a depth greater than that of the second semiconductor region 1PB.

The semiconductor substrate 1N has an N-type semiconductor region 1PC. The semiconductor region 1PC is formed on the main surface 1Na side of the semiconductor substrate 1N. The semiconductor region 1PC prevents a PN joining part, which is formed between the N-type semiconductor substrate 1N and the P-type first semiconductor region 1PA, from being exposed in a through-hole TH in which the penetration electrode TE is disposed. The semiconductor region 1PC is formed at a position corresponding to the through-hole TH (penetration electrode TE).

The insulating layer L1 is formed on the surface of the second semiconductor region 1PB, and the common electrode E3 and the reading wiring TL are formed thereon. The common electrode E3 and the reading wiring TL are covered with an insulating layer L3. The main surface 1Nb of the semiconductor substrate 1N is covered with an insulating layer L2. The insulating layer L2 has an opening, and the penetration electrode TE passes through the inside of the opening. The common electrode E3 comes into contact with the penetration electrode TE and is electrically connected thereto. A first bump electrode BE is in contact with the top of the penetration electrode TE via an under-bump metal BM. An inner surface of the through-hole TH provided in the semiconductor substrate 1N is covered with the insulating layer L2. The penetration electrode TE and the insulating layer L2 are covered with a passivation film (protective film) PF. As a method for forming an under-bump metal BM, an electroless plating method can be used. As a method for forming a first bump electrode BE, a technique of installing a soldering ball or a printing method can be used.

As described above, each of the semiconductor chips includes the semiconductor substrate 1N which has the plurality of optical detection portions 10 being two-dimensionally disposed, the insulating layer L1 which is formed on the main surface 1Na of the semiconductor substrate 1N, the common electrode E3 which is disposed on the insulating layer L1, the reading wiring TL which electrically connects the quenching resistor R1 and the common electrode E3 to each other in each of the optical detection portions 10, and the penetration electrode TE which extends from the common electrode E3 to the main surface 1Nb of the semiconductor substrate 1N via the through-hole TH of the semiconductor substrate 1N.

Each of the photodiode arrays PDA includes the penetration electrode TE. The penetration electrode TE is provided for each of the photodiode arrays PDA, that is, for each of the channels. The penetration electrode TE is formed by penetrating the semiconductor substrate 1N from the main surface 1Na side to the main surface 1Nb side. That is, the penetration electrode TE is disposed inside the through-hole TH penetrating the semiconductor substrate 1N. The insulating layer L2 is also formed inside the through-hole TH. Therefore, the penetration electrode TE is disposed inside the through-hole TH via the insulating layer L2. One end of the penetration electrode TE is connected to the common electrode E3 such that the reading wiring TL and the penetration electrode TE are connected to each other.

Each of the optical detection portions 10 includes the APD 11a. However, each of the APDs 11a includes the semiconductor substrate 1N and the second semiconductor region. 1PB which constitutes the semiconductor substrate 1N and a pn-joining part and outputs a carrier. The quenching resistor R1 is electrically connected to the second semiconductor region 1PB of the APD 11a.

The first bump electrode BE electrically connects the penetration electrode TE and the first wiring substrate 20 to each other, and a bump electrode B2 electrically connects a semiconductor region 12 (first semiconductor region) of the APD and the first wiring substrate 20 to each other.

The quenching resistor R1 has resistivity higher than those of the electrode E1, to which the quenching resistor R1 is connected, and the common electrode E3. For example, the quenching resistor R1 is formed of polysilicon or the like. As a method for forming a quenching resistor R1, a chemical vapor deposition (CVD) method can be used. In addition, examples of a resistor constituting the quenching resistor R1 include SiCr, NiCr, TaNi, and FeCr.

The electrodes E1 and E3 and the penetration electrode TE are formed of metal such as aluminum. When the semiconductor substrate 1N is formed of Si, as a material of the electrodes, AuGe/Ni or the like are often used, in addition to aluminum. As a method for forming the electrodes E1 and E3 and the penetration electrode TE, a sputtering method can be used.

When Si is used, Group 3 elements, such as B, are used as P-type impurities, and Group 5 elements, such as N, P and As, are used as N-type impurities. In a semiconductor, even if an element is constituted by switching between the N-type and the P-type which are the types of conduction, the element can function. As a method for adding these impurities, a diffusion method or an ion implantation method can be used.

As a material of the insulating layers described above, $SiO_2$ or SiN can be used. As a method for forming an insulating layer, when each of the insulating layers is formed of $SiO_2$, a thermal oxidation method or a sputtering method can be used.

In the case of the structure described above, the APD 11a are formed by constituting a pn-joining part between the N-type semiconductor substrate 1N and the P-type first semiconductor region 1PA. The first semiconductor region 1PA is connected to the first wiring substrate 20 via the second semiconductor region 1PB, the electrode E1, the quenching resistor 11r, the reading wiring TL, the common electrode E3, the penetration electrode TE, and the first bump electrode BE in order. The main surface 1Nb of the semiconductor substrate 1N is connected to the first wiring substrate 20 via the bump electrode B2 (refer to FIG. 7). The quenching resistor 11r is connected to the APD 11a in series.

Here, the first wiring substrate 20 includes a plurality of electrodes E9 disposed on a first main surface 20a side. The electrode E9 is disposed to correspond to the penetration electrode TE. The electrode E9 is provided to correspond to each channel (photodiode array PDA). The penetration electrode TE and the electrode E9 are connected to each other by the first bump electrode BE. Accordingly, an electrode E3 is electrically connected to the electrode E9 via the penetration electrode TE and the first bump electrode BE. The electrode E9 is formed of metal such as aluminum in the same manner as those of the electrodes E1 and E3 and the penetration electrode TE. Each of the electrodes E9 is electrically connected to the signal processing portion via a wiring (not illustrated), a bonding wire, or the like formed inside the first wiring substrate 20.

Figure 8:
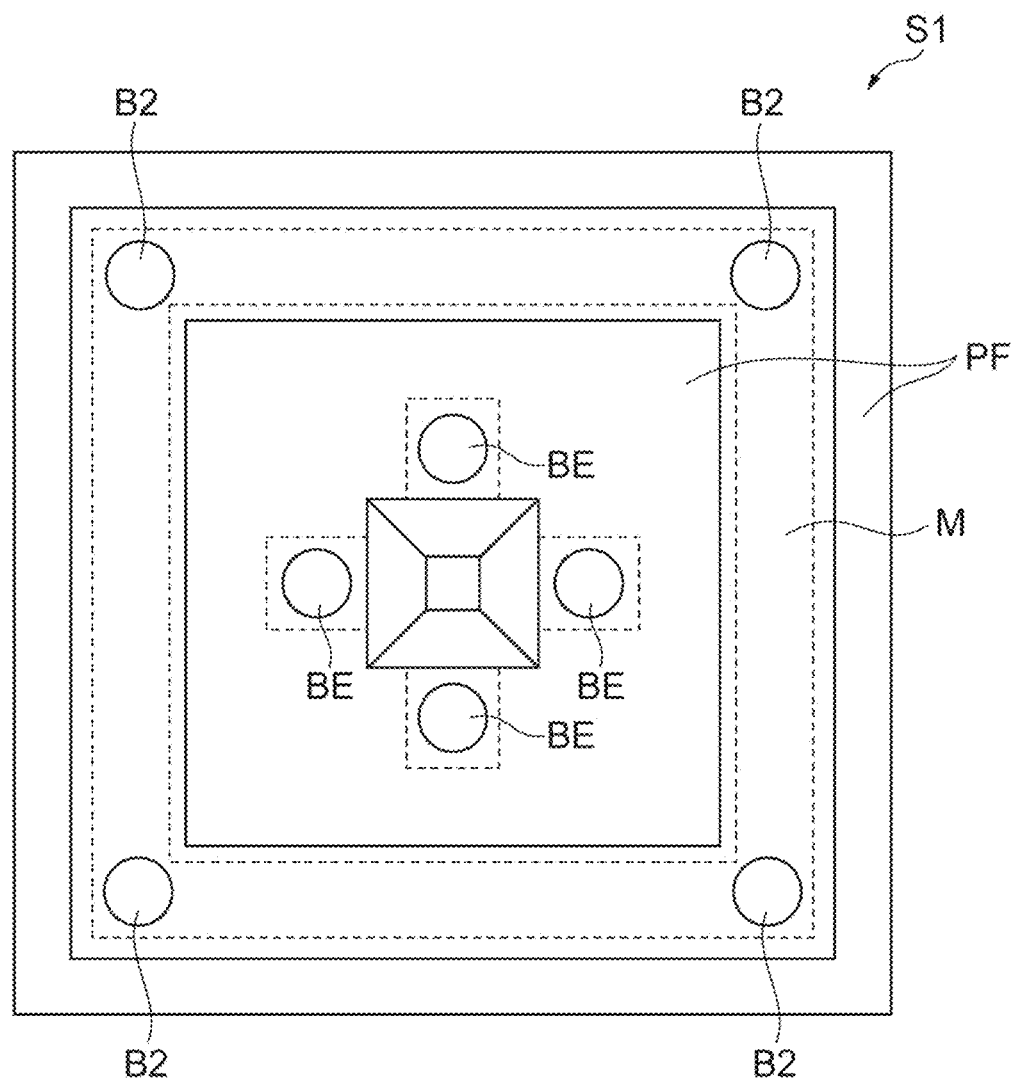
FIG. 8 is a schematic bottom view of the optical detection unit illustrated in FIG. 1.

FIG. 8 is a bottom view of the semiconductor chip illustrated in FIG. 3. As illustrated in FIGS. 7 and 8, a part of the passivation film PF on the main surface 1Nb of the semiconductor substrate 1N is removed, such that the main surface 1Nb of the semiconductor substrate 1N is exposed. A conductive film M is formed in this exposed region, and the bump electrode B2 is disposed on the conductive film M. The conductive film M has a rectangular ring shape, and the material thereof can be the same as the material of the electrodes. As a material of the bump electrode, solder can be used. The first bump electrode BE is positioned in the middle of the semiconductor substrate 1N. The bump electrode B2 is disposed at positions corresponding to four corner parts of the semiconductor substrate 1N having a quadrangular shape.

As described above, a bias voltage operating in the Geiger mode is applied to both ends of the APD 11a included in each of the optical detection portions 10 via the first bump electrode BE and the bump electrode B2. A carrier which is generated due to incident light (energy line) in the plurality of APDs 11a flows to the common electrode E3 on the semiconductor substrate 1N via each of the quenching resistor 11r, arrives at the first wiring substrate 20 through the penetration electrode TE and the first bump electrode BE from the common electrode E3, and is then taken out.

In the APD 11a having the structure, wiring resistance is reduced due to a structure in which a path for transmitting a carrier is shortened using a penetration electrode and the like. Therefore, the transmission speed of a carrier from the APD 11a, that is, time resolution is improved. When a plurality of photons are incident on one optical detection chip S1 including a plurality of APDs 11a, since the time resolution is improved, photons can be detected with higher accuracy. In addition, in different optical detection chips S1, due to a manufacturing error or the like, although it is not guaranteed to have the same time resolution, if optical detection chips S1 having product characteristic within a uniform range are selected at the time of assembling and are bonded to the first wiring substrate 20 via the bump electrode, characteristic variance in the optical detection chips S1 are reduced.

Since the optical detection chips S1 are two-dimensionally arranged away from each other, it is possible to minimize the influence of light which has been incident on a particular optical detection chip S1 and leaks to another optical detection chip S1 generating crosstalk, and a space between the optical detection chips S1 can alleviate the influence of warpage of the first wiring substrate 20 with respect to the optical detection chip S1 caused by expansion and contraction of the first wiring substrate 20. That is, the characteristic of the optical detection unit D, such as time resolution, crosstalk, and resistance against a temperature change, are extremely improved. Subsequently, a structure for further minimizing crosstalk wilt be described.

Figure 9:
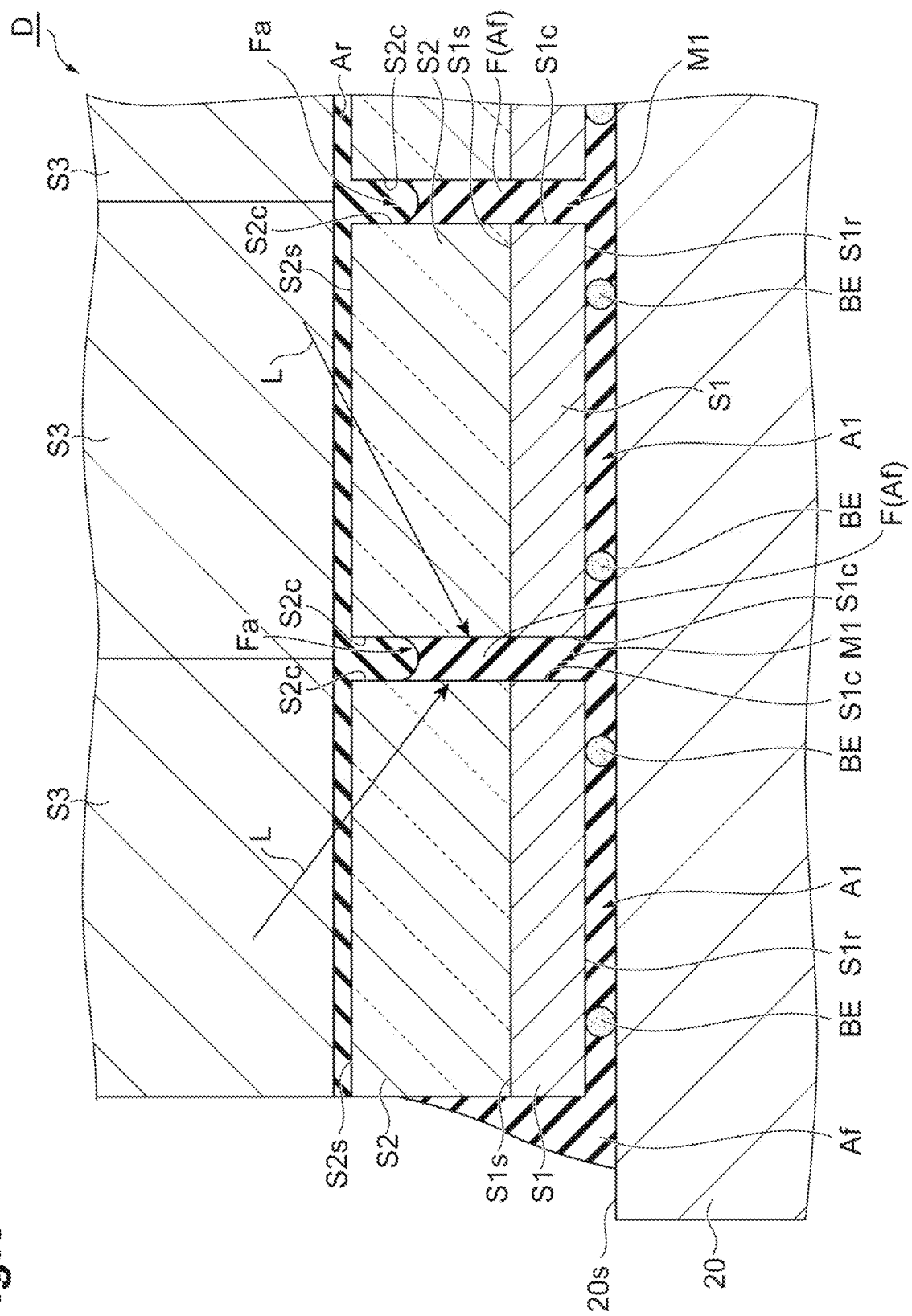
FIG. 9 is a schematic cross-sectional view of the optical detection unit illustrated in FIG. 1.

FIG. 9 is a schematic cross-sectional view of the optical detection unit illustrated in FIG. 1. As illustrated in FIG. 9, the optical detection unit D includes the first wiring substrate 20 having the first main surface 20s as described above, the optical detection chips (SiPM chips) S1 which includes the Geiger-mode APD (APD 11a) and are two-dimensionally arranged on the first main surface 20s, and the first bump electrode BE (bump electrode B2) for electrically connecting the optical detection chip S1 to the first wiring substrate 20. The optical detection chip S1 includes the light receiving surface S1s, the rear surface S1r on a side opposite to the light receiving surface S1s, and a side surface S1c connecting the light receiving surface S1s and the rear surface S1r to each other. For example, the light receiving surface S1s serves as the main surface 1Na described above, and for example, the rear surface S1r serves as the main surface 1Nb described above (refer to FIG. 7).

In a state in which the rear surface S1r faces the first main surface 20s, the optical detection chip S1 is mounted on the first wiring substrate 20 by the first bump electrode BE. The rear surface S1r of the optical detection chip S1 and the first main surface 20s of the first wiring substrate 20 are away from each other. Therefore, a gap (first lower region A1) is formed between the rear surface S1r and the first main surface 20s.

The optical detection unit D further includes the glass member S2 provided on the light receiving surface S1s, and the scintillator S3 provided on the light receiving surface S1s and the glass member S2. One glass member S2 is provided for one optical detection chip S1. The glass member S2 includes a light incidence surface S2s on a side opposite to a surface on the light receiving surface S1s side. Detection target light L generated by the scintillator S3 is incident on the light incidence surface S2s in response to radiation rays. The detection target light L is transmitted through the glass member S2.

That is, the glass member S2 is a light transmitting portion provided on the light receiving surface S1s. Therefore, here, the light transmitting portion is the glass member S2 attached to the light receiving surface S1s of each of the optical detection chips S1. For example, the glass member S2 is bonded to the light receiving surface S1s by a bonding layer (not illustrated). Here, when seen in a first direction intersecting (orthogonal to) the first main surface 20s, the external shape of the optical detection chip S1 and the external shape of the glass member S2 substantially coincide with each other. The scintillator S3 is bonded to the light incidence surface S2s of the glass member S2 by a bonding layer (coupling layer) Ar.

The optical detection chips S1 are away from each other, and the glass members S2 are away from each other. Therefore, when seen in the first direction, between optical detection chips S1 adjacent to each other, a gap (intermediate region M1) is formed. The intermediate region M1 is continuously formed between the side surfaces S1c of the optical detection chips S1 adjacent to each other and between side surfaces S2c of a glass members S2 adjacent to each other.

A resin portion Af is disposed on the first main surface 20s of the first wiring substrate 20. The resin portion Af has light reflection properties or light absorption properties with respect to at least the detection target light generated in the scintillator S3. When the resin portion Af has light reflection properties, the resin portion. Af is constituted of a white resin, for example. In addition, when the resin portion Af has light absorption properties, the resin portion Af is constituted of a black resin, for example.

The resin portion Af is disposed in at least the first lower region A1 and the intermediate region M1. Accordingly, the resin portion Af protects the optical detection chip S1, and a joining portion between the optical detection chip S1 and the first bump electrode BE. Particularly, a part of the resin portion Af disposed in the intermediate region M1 is a light shielding portion. F which blocks the detection target light L incident on the glass member S2 from being incident on another glass member S2. Therefore, as the resin portion Af, the light shielding portion F is integrally provided over the intermediate region M1 and the first lower region A1.

In the intermediate region M1, the light shielding portion F is provided to reach the glass member S2 side of the light receiving surface S1s from the position on the side surface S1c. Here, the expression "the glass member S2 side of the light receiving surface S1s" denotes, as an example, "a side of a position corresponding to the light receiving surface S1s in the intermediate region M1 when seen in a direction along the first main surface 20s, that is, a position corresponding to the light incidence surface S2s of the glass member S2 in the intermediate region M1 from the position of the light receiving surface S1s on an extended line, that is, a position of the light incidence surface S2s on an extended line". The light shielding portion F is provided on the side surface S1c of the optical detection chip S1 and the side surface S2c of the glass member S2. However, an end portion Fa of the light shielding portion F does not reach the light incidence surface S2s of the glass member S2 in the first direction and is positioned on the first main surface 20s side of the light incidence surface S2s. In addition, the end portion Fa of the light shielding portion F is recessed toward the first main surface 20s side (projected toward the first main surface 20s side). The bonding layer Ar is also disposed inside the recessed end portion Fa of the light shielding portion F, in the manufacturing step.

Here, a position of the end portion Fa of the light shielding portion F can be set as follows. That is, a distance from a position corresponding to the light receiving surface S1s to the end portion Fa can be longer than the distance from the end portion Fa to a position corresponding to the light incidence surface S2s. In addition, the distance from a position corresponding to the light receiving surface S1s to the end portion Fa can be ⅔ times or greater than the thickness of the glass member S2 (dimensions in a direction intersecting the first main surface 20s). Here, the standard for the distance of the end portion Fa is an edge part regulating the recess, that is, a peripheral edge part which is risen and is in contact with the glass member S2.

Figure 10:
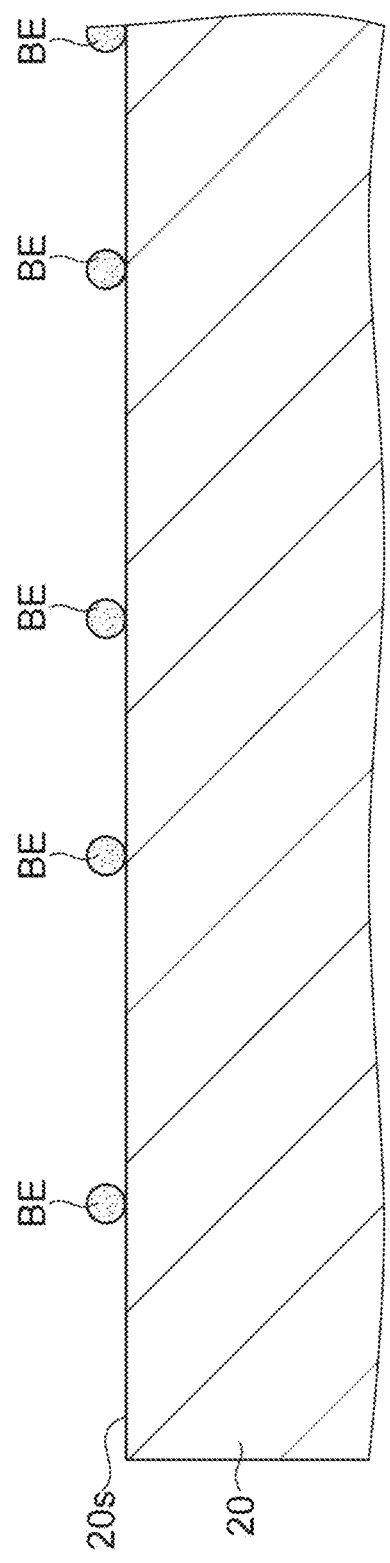
FIG. 10 is a view illustrating a main step of a method for manufacturing an optical detection unit illustrated in FIG. 9.

Subsequently, an example of a method for manufacturing an optical detection unit D will be described. FIGS. 10 to 14 are views illustrating main steps of the method for manufacturing an optical detection unit illustrated in FIG. 9. As illustrated in FIG. 10, here, first, the first wiring substrate 20 and the optical detection chips S1 are prepared (first step). Then, a plurality of first bump electrodes BE (bump electrodes B2) are provided on the first main surface 20s of the first wiring substrate 20. As a method for forming a first bump electrode BE, a technique of installing a soldering ball or a printing method can be used.

Figure 11:
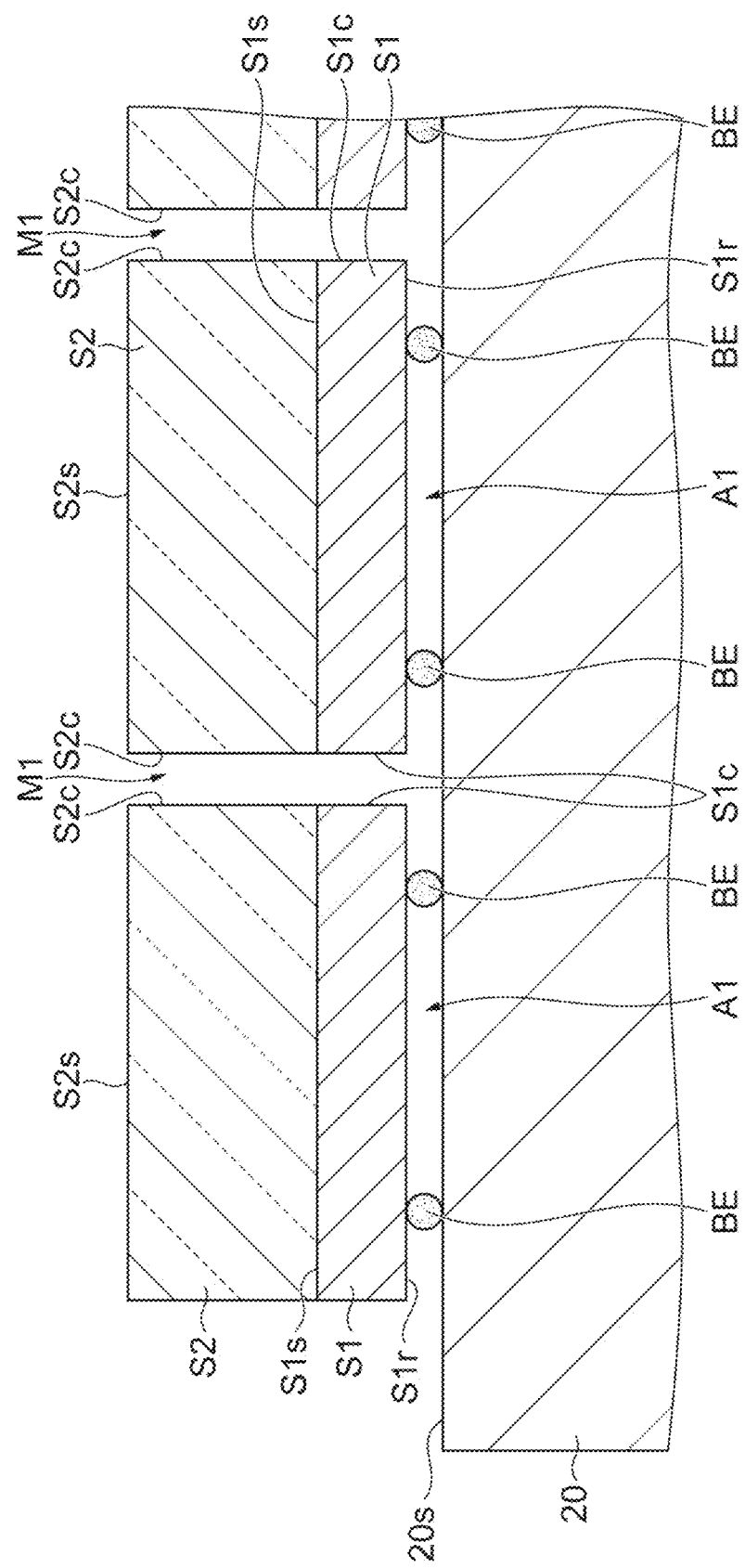
FIG. 11 is a view illustrating another main step of the method for manufacturing an optical detection unit illustrated in FIG. 9.

Subsequently, as illustrated in FIG. 11, the optical detection chips S1 are disposed on the first bump electrode BE (second step). Here, a plurality of optical detection chips S1 are disposed on the first main surface 20s such that the rear surfaces S1r of the optical detection chips S1 face the first main surface 20s of the first wiring substrate 20 and are two-dimensionally arranged on the first main surface 20s. At this time, the first bump electrode BE is disposed on the first main surface 20s as described above. Therefore, in this second step, the plurality of optical detection chips S1 are disposed on the first main surface 20s while the first bump electrode BE is interposed between the rear surface S1r and the first main surface 20s. The glass member S2 is attached to the optical detection chip S1. Subsequently, the optical detection chips S1 are fixed and mounted on the first main surface 20s by a reflow of solder of the first bump electrode BE (third step).

Figure 12:
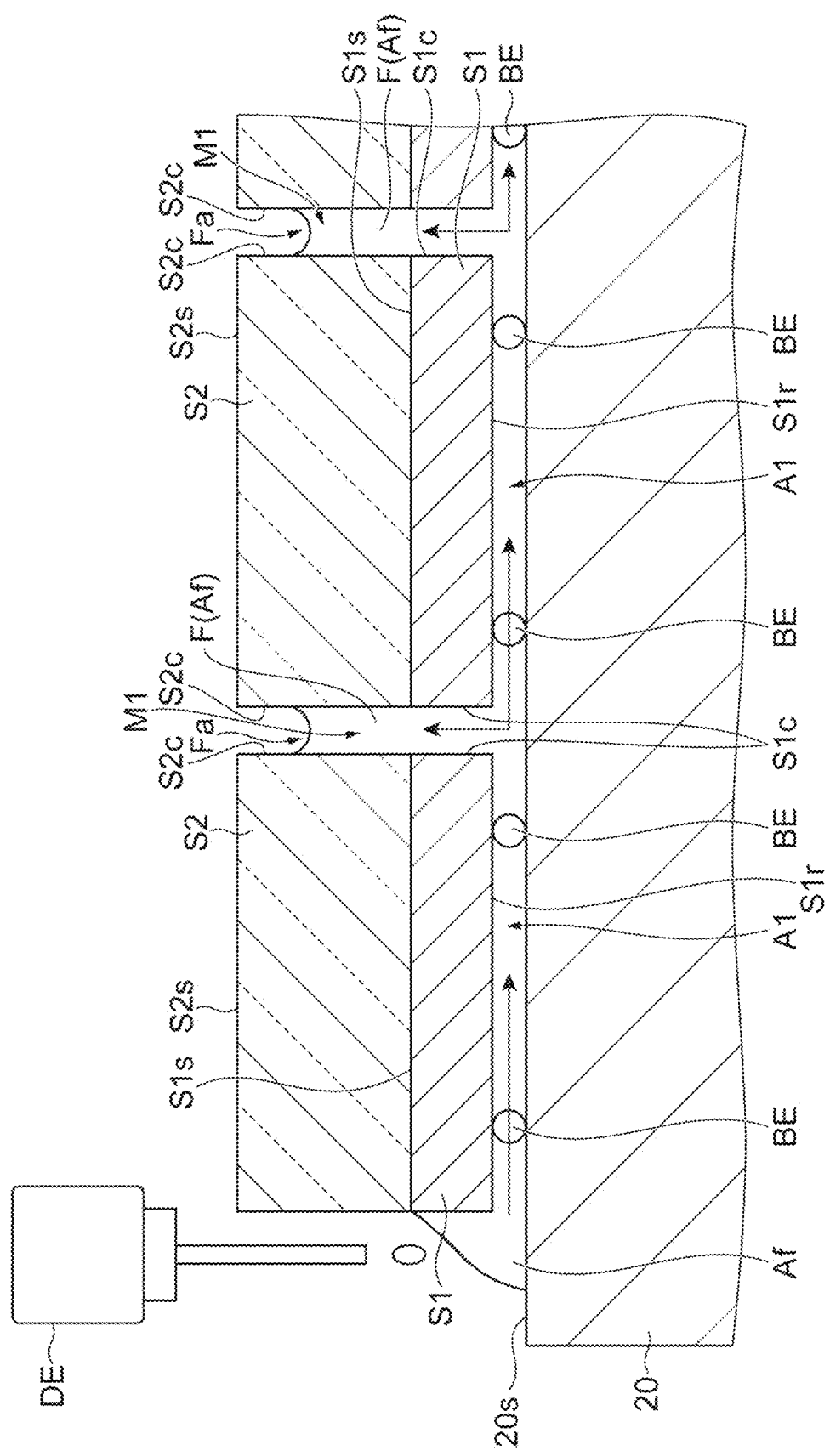
FIG. 12 is a view illustrating another main step of the method for manufacturing an optical detection unit illustrated in FIG. 9.
Figure 13:
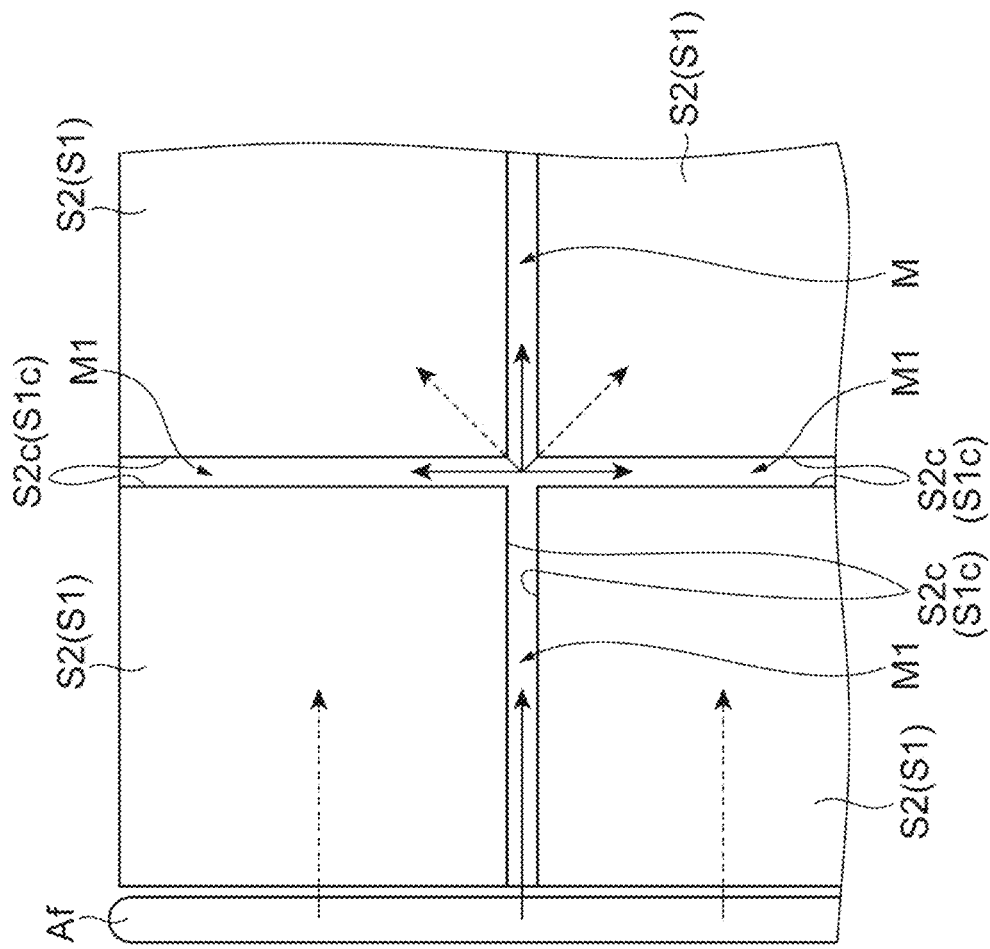
FIG. 13 is a view illustrating another main step of the method for manufacturing an optical detection unit illustrated in FIG. 9.

Subsequently, as illustrated in FIGS. 12 and 13, the intermediate region M1 positioned between optical detection chips S1 adjacent to each other when seen in the first direction, and the first lower region A1 between the first main surface 20s and the rear surface S1r are filled with an underfill resin A having light reflection properties or light absorption properties (fourth step). More specifically, here, a coating apparatus DE for applying a resin is disposed outside the optical detection chips S1 in the outermost portion on the first main surface 20s, and the underfill resin A is disposed on the first main surface 20s.

Accordingly, due to a capillary phenomenon, the underfill resin A enters a space between the first main surface 20s and the rear surface S1r (that is, the first lower region A1), and a space between the side surfaces S1c and S2c (that is, the intermediate region M1) (proceeds in the arrow direction in FIGS. 12 and 13). In FIG. 12, hatching of the underfill resin A and the first bump electrode BE is omitted.

Figure 14:
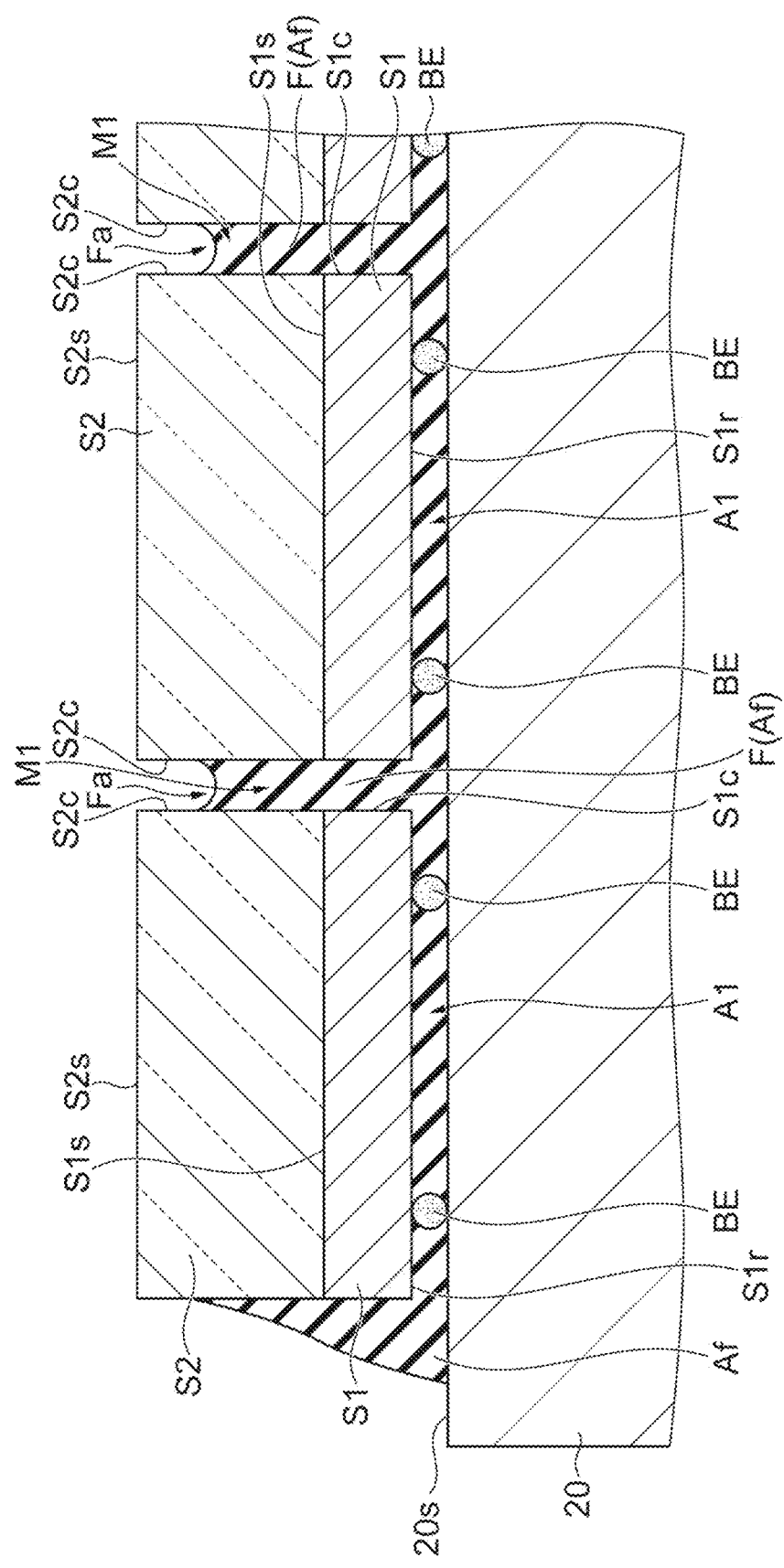
FIG. 14 is a view illustrating another main step of the method for manufacturing an optical detection unit illustrated in FIG. 9.

Subsequently, as illustrated in FIG. 14, the resin portion Af is constituted by hardening the underfill resin A. In the fourth step, the light shielding portion F is constituted by filling the intermediate region M1 with the underfill resin A at least to the glass member S2 side of the light receiving surface S1s. Then, as illustrated in FIG. 9, the scintillator S3 is bonded to the glass member S2 via the bonding layer Ar, and thus the optical detection unit D is manufactured.

As described above, in the optical detection unit D, the optical detection chips S1 including the Geiger-mode APD (avalanche photodiode which operates in a Geiger mode) are two-dimensionally arranged on the first main surface 20s of the first wiring substrate 20 and are mounted (tiled) by the first bump electrode BE. As the light transmitting portion, the glass member S2 is provided on the light receiving surface S1s of the optical detection chip S1. Then, the light shielding portion F is provided in the intermediate region M1 between optical detection chips S1 adjacent to each other at least on the glass member S2 side of the light receiving surface S1s of the optical detection chip S1. Therefore, stray light of the detection target light L incident on the glass member S2 on the light receiving surface S1s or the light receiving surface S1s of one optical detection chip S1 from the glass member S2 on the light receiving surface S1s of another optical detection chip S1 is minimized. Therefore, crosstalk between optical detection chips S1 including the Geiger-mode APD can be minimized.

In addition, in the optical detection unit D, the glass member S2 includes the light incidence surface S2s on a side opposite to a surface on the light receiving surface S1s side. In addition, the end portion Fa of the light shielding portion F on the light incidence surface S2s side in the first direction is positioned on the first main surface 20s side of the light incidence surface S2s and is recessed toward the first main surface 20s side. Therefore, the light shielding portion F can avoid overlapping the light receiving surface S1s when seen in the first direction. In addition, when an adhesive such as a resin is disposed on the glass member S2, a surplus adhesive can escape due to the recess at the end portion Fa of the light shielding portion F. Accordingly, for example, the bonding layer Ar can be uniformly and thinly formed.

This will be more specifically described. From the viewpoint of minimizing crosstalk, it is possible to consider that the underfill resin A is raised such that the end portion Fa of the light shielding portion F is positioned close to the light incidence surface S2s of the glass member S2 as much as possible (that is, the light shielding portion F is provided close to the light incidence surface S2s as much as possible). However, if the underfill resin A is disposed on the light incidence surface S2s, the light shielding portion F is formed on the light incidence surface S2s. As a result, there is concern that the detection target light L is hindered from being incident on the glass member S2. As described above, the configuration in which "the end portion Fa of the light shielding portion F on the light incidence surface S2s side is positioned on the first main surface 20s side of the light incidence surface S2s and is recessed toward the first main surface 20s side" indicates a configuration in which the light shielding portion F is provided close to the light incidence surface S2s as much as possible to minimize crosstalk, and while avoiding forming the light shielding portion F on the light incidence surface S2s, an escape space for a surplus adhesive can be ensured.

Moreover, in the optical detection unit D, the light shielding portion F is integrally provided over the intermediate region M1 and the first lower region A1. Therefore, for example, the light shielding portion F can be collectively constituted by filling the intermediate region M1 and the first lower region A1 with the underfill resin A having light reflection properties or light absorption properties.

Here, in the method for manufacturing an optical detection unit D according to the present embodiment, after the optical detection chips S1 are mounted on the first main surface 20s of the first wiring substrate 20, the intermediate region M1 and the first lower region A1 are filled with the underfill resin A having light reflection properties or optical transparency. At this time, the light shielding portion F is constituted by filling the intermediate region M1 with the underfill resin A at least to the glass member S2 side of the light receiving surface S1s. Therefore, in a manufactured optical detection unit D, stray light of the detection target light L incident on the glass member on the light receiving surface S1s or the light receiving surface S1s of one optical detection chip S1 from the glass member S2 on the light receiving surface S1s of another optical detection chip S1 is minimized. That is, according to this method, it is possible to manufacture an optical detection unit D in which crosstalk between optical detection chips S1 can be minimized.

Figure 15:
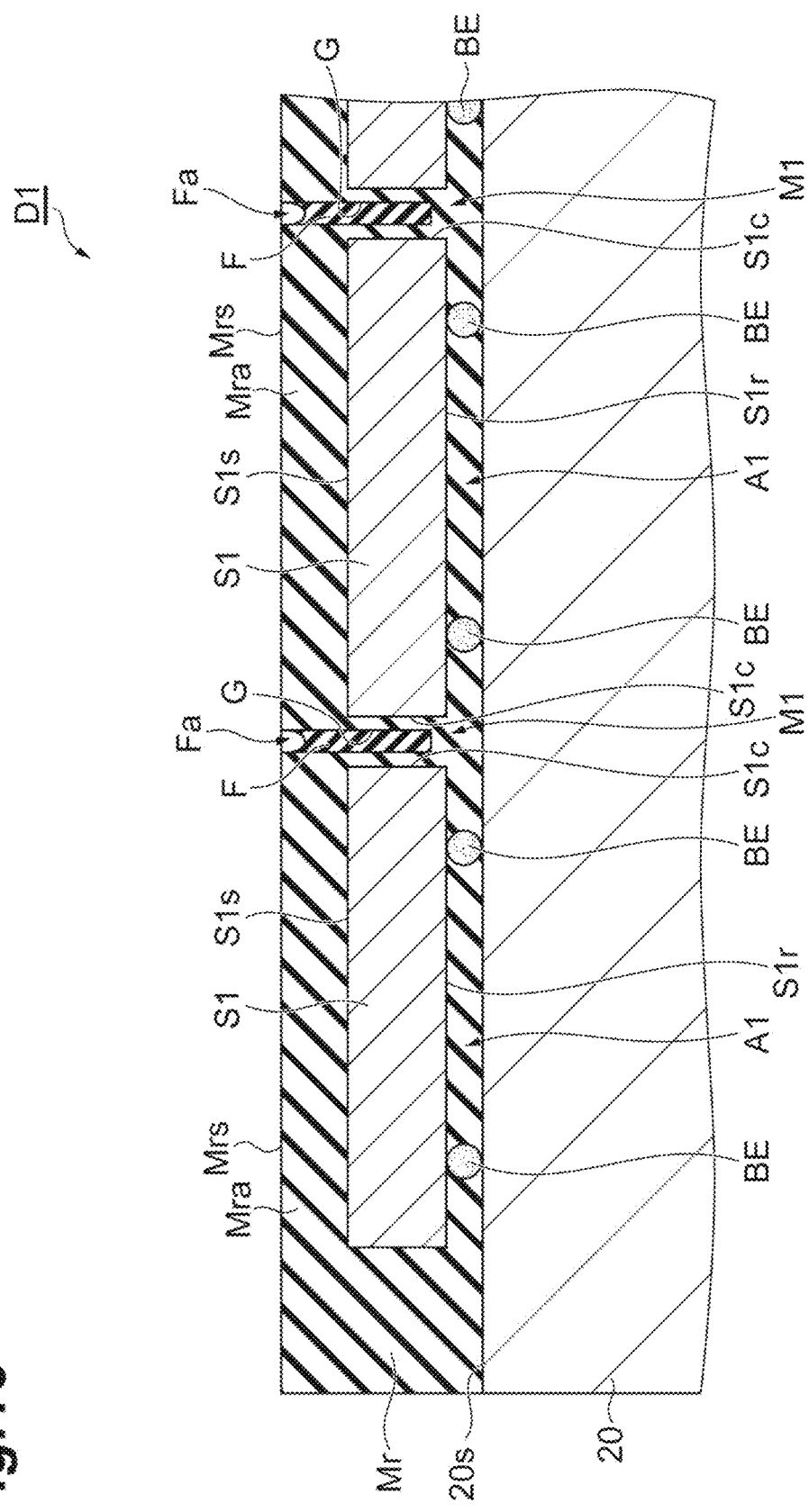
FIG. 15 is a schematic cross-sectional view of an optical detection unit according to a modification example.

Subsequently, an optical detection unit according to a modification example will be described. FIG. 15 is a schematic cross-sectional view of the optical detection unit according to the modification example. As illustrated in FIG. 15, an optical detection unit D1 differs from the optical detection unit D in including a resin portion Mr, in place of the resin portion Af. The resin portion Mr integrally seals a plurality of optical detection chips S1. The intermediate region M1 and the first lower region A1 are filled with the resin portion Mr. In addition, the resin portion Mr covers the light receiving surface S1s, the rear surface S1r, and the side surface S1c of each of the optical detection chips S1. For example, the resin portion. Mr is formed of a mold resin having optical transparency. Therefore, a resin portion Mra which is a part of the resin portion Mr on the light receiving surface S1s is a light transmitting portion provided on the light receiving surface S1s.

The resin portion Mra includes a light incidence surface Mrs on a side opposite to a surface on the light receiving surface S1s side. A groove portion G positioned in the intermediate region M1 is provided in the resin portion Mra. The groove portion G is provided in the intermediate region M1 at least on the resin portion Mra side of the light receiving surface S1s. Here, the expression "the resin portion Mra side of the light receiving surface S1s" denotes, as an example, "a side of a position corresponding to the light receiving surface S1s in the intermediate region M1 when seen in a direction along the first main surface 20s, that is, a position corresponding to the light incidence surface Mrs of the resin portion Mra in the intermediate region M1 from the position of the light receiving surface S1s on an extended line, that is, a position of the light incidence surface Mrs on an extended line". Here, the groove portion G extends from the light incidence surface Mrs beyond the light receiving surface S1s to the side surface S1c of the optical detection chip S1.

The light shielding portion F is disposed inside the groove portion G. Accordingly, the light shielding portion F is provided in the intermediate region M1 from the position on the side surface S1c beyond the light receiving surface S1s to the resin portion Mra side of the light receiving surface S1s. However, in this case as well, in the light shielding portion F, the end portion Fa of the light shielding portion F does not reach the light incidence surface Mrs of the resin portion Mra in the first direction intersecting the first main surface 20s of the first wiring substrate 20 and is positioned on the first main surface 20s side of the light incidence surface Mrs. In addition, the end portion Fa of the light shielding portion F is recessed toward the first main surface 20s side (projected toward the first main surface 20s side).

Figure 16:
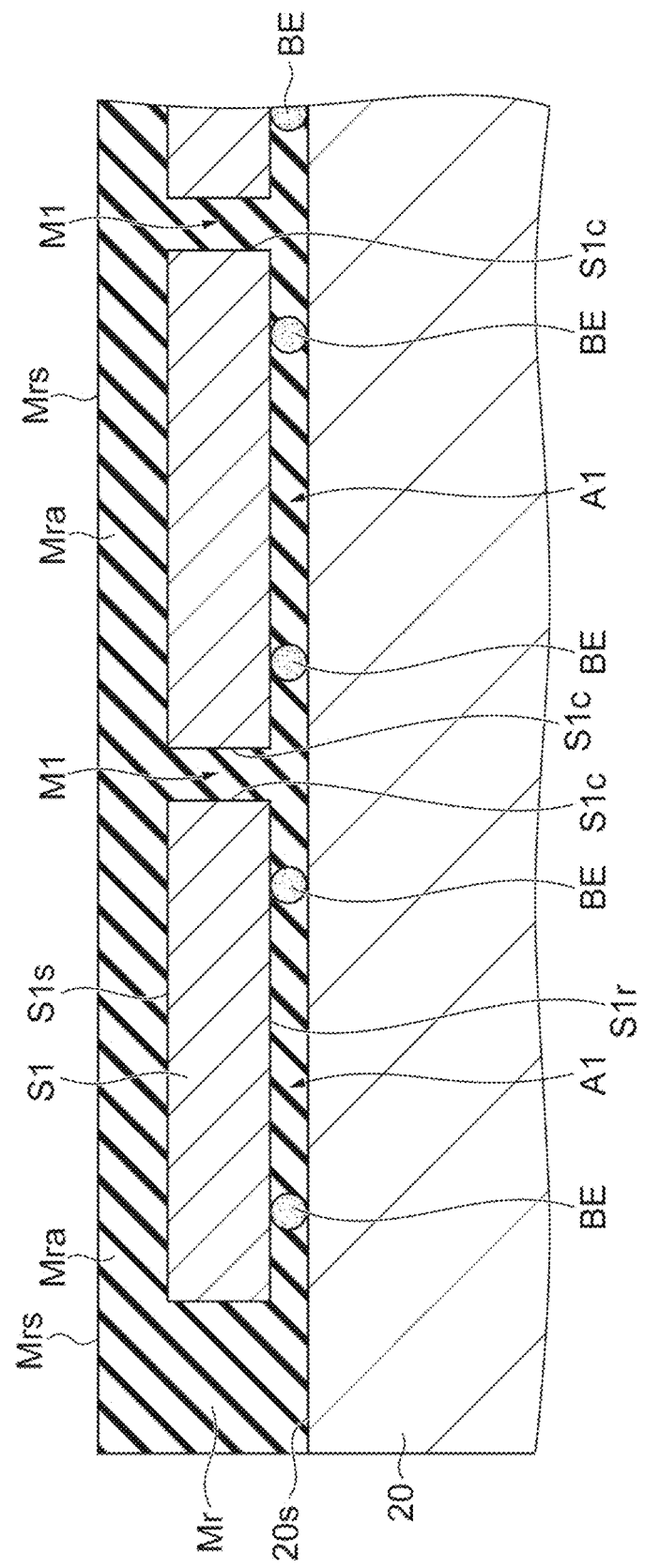
FIG. 16 is a view illustrating a main step of a method for manufacturing an optical detection unit illustrated in FIG. 15.

Subsequently, a method for manufacturing an optical detection unit D1 will be described. The method for manufacturing an optical detection unit D1 includes steps similar to the first to third steps of the method for manufacturing an optical detection unit D described above. In other words, in the method for manufacturing an optical detection unit D1, the optical detection chips S1 are fixed and mounted on the first main surface 20s of the first wiring substrate 20 by performing the first to third steps described above. Subsequently, as illustrated in FIG. 16, for example, the plurality of optical detection chips S1 are integrally sealed with a mold resin having optical transparency (fourth step). Accordingly, the resin portion Mr is constituted, and the resin portion Mra is collectively constituted as a light transmitting portion on a plurality of light receiving surfaces S1s (fourth step).

Figure 17:
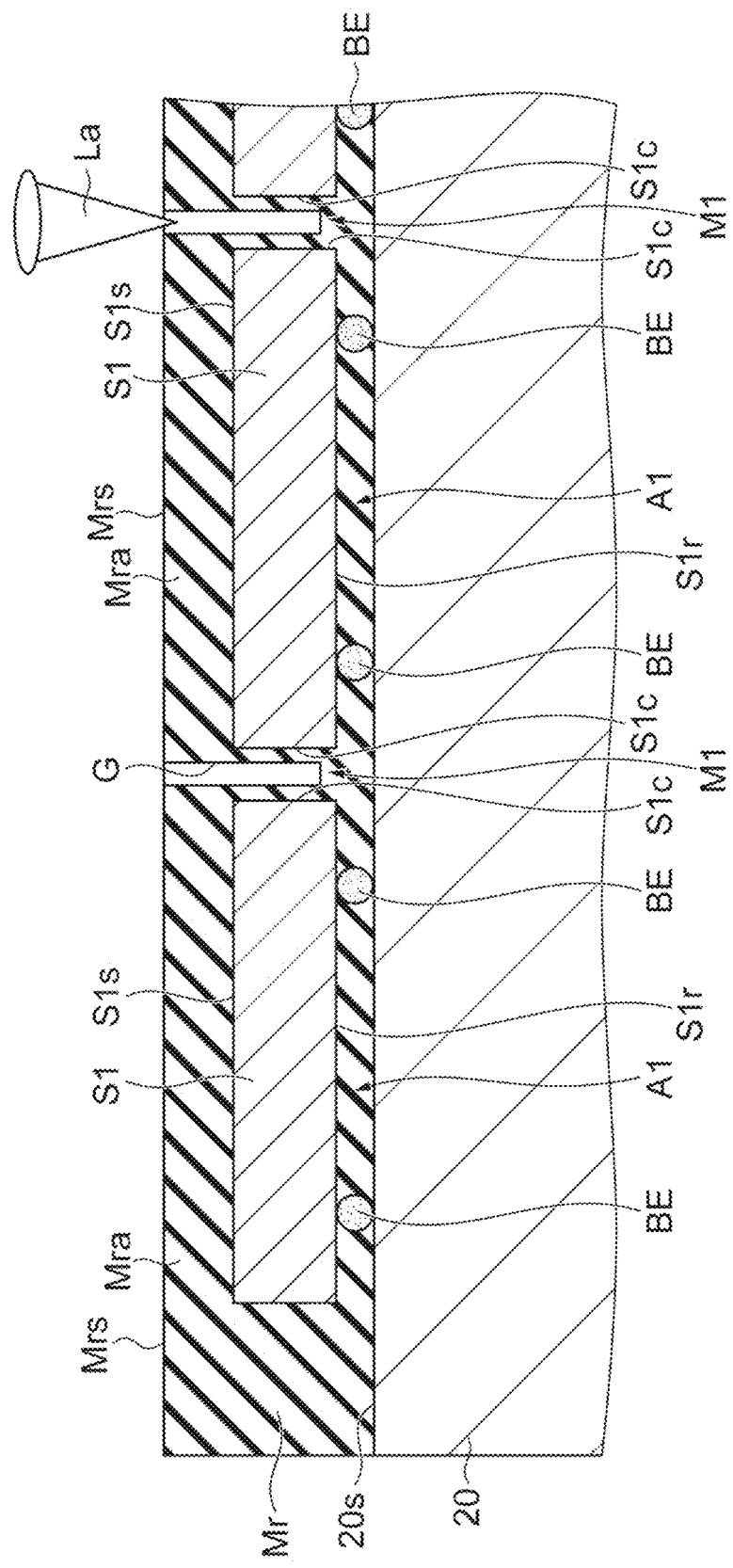
FIG. 17 is a view illustrating another main step of the method for manufacturing an optical detection unit illustrated in FIG. 15.

Subsequently, as illustrated in FIG. 17, the groove portion G is formed in the resin portion Mr to be positioned in the intermediate region M1 when seen in the first direction (fifth step). Here, the groove portion G is formed in the intermediate region M1 at least on the resin portion Mra side of the light receiving surface S1s. For example, the groove portion G can be formed by irradiating the resin portion Mr with a laser beam La (for example, laser ablation). Thereafter, as illustrated in FIG. 15, the light shielding portion F is constituted by filling the inside of the groove portion G with a resin having light reflection properties or light absorption properties (sixth step). Then, the scintillator S3 is provided to face each of the light receiving surfaces S1s via the resin portion Mra (not illustrated), and thus an optical detection unit D1 is manufactured.

As described above, even in the optical detection unit D1 according to the modification example of, similar to the optical detection unit D, the light shielding portion F is provided in the intermediate region M1 between optical detection chips S1 adjacent to each other at least on the resin portion. Mra side of the light receiving surface S1s of the optical detection chip S1. Therefore, stray light of the detection target light L incident on the resin portion Mra on the light receiving surface S1s or the light receiving surface S1s of one optical detection chip S1 from the glass member S2 on the light receiving surface S1s of another optical detection chip S1 is minimized. Therefore, crosstalk between optical detection chips S1 including the Geiger-mode APD can be minimized. In addition, even in the manufacturing method according to the modification example, it is possible to manufacture an optical detection unit D1 in which crosstalk between optical detection chips S1 can be minimized.

Figure 18:
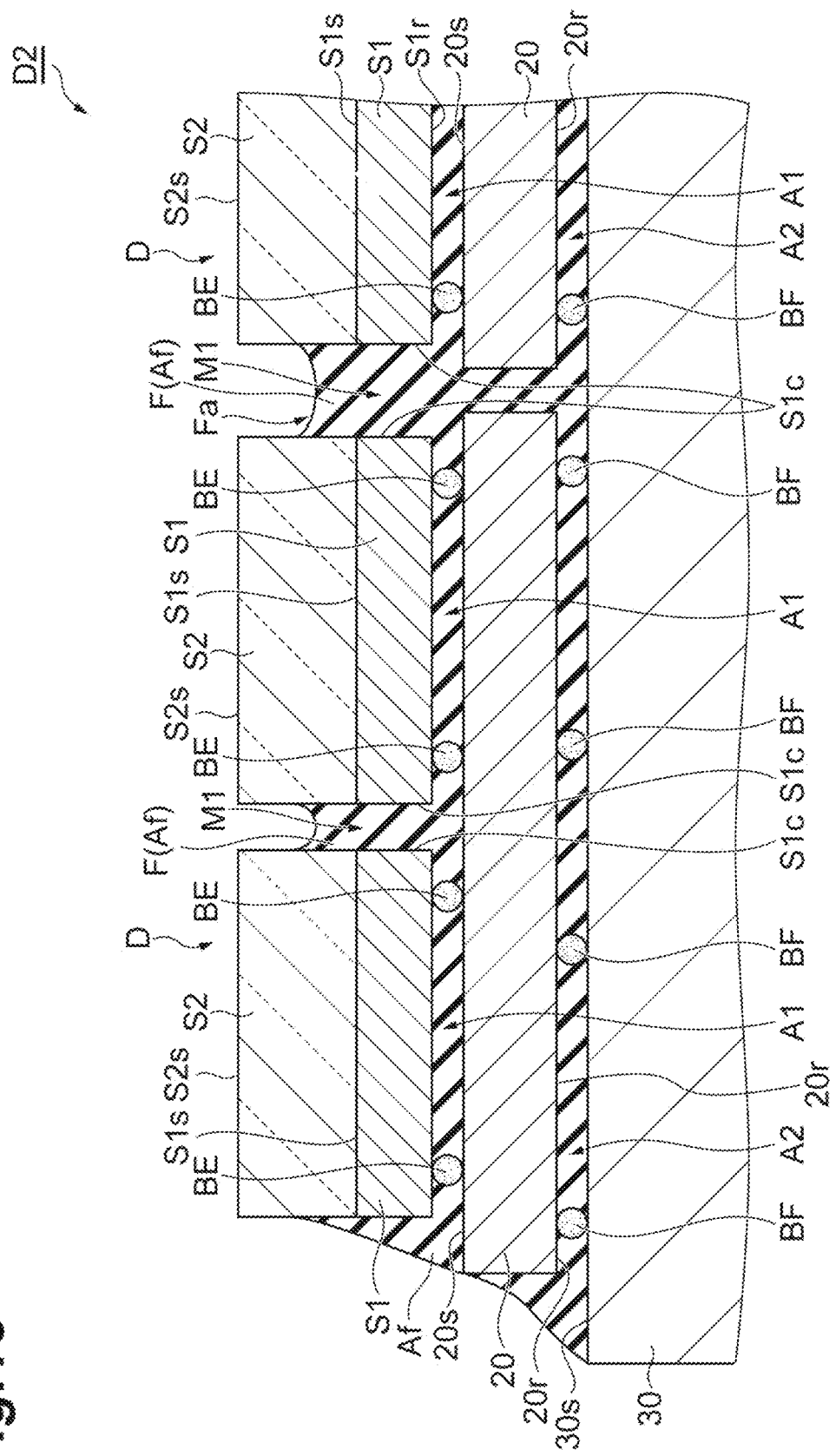
FIG. 18 is a schematic cross-sectional view of an optical detection device including an optical detection unit illustrated in FIG. 9.

Subsequently, an optical detection device including an optical detection unit D will be described. FIG. 18 is a schematic cross-sectional view of an optical detection device including an optical detection unit illustrated in FIG. 9. In FIG. 18, the scintillator S3 is omitted. As illustrated in FIG. 18, an optical detection device D2 includes a plurality of optical detection units D, a second wiring substrate 30, and a second bump electrode BF which electrically connects the optical detection units D to the second wiring substrate 30. The second wiring substrate 30 has a second main surface 30s.

The optical detection units D are arranged along the second main surface 30s and are mounted on the second wiring substrate 30 by the second bump electrode BF in a state in which a bottom surface 20r on a side opposite to the first main surface 20s of the first wiring substrate 20 faces the second main surface 30s. The bottom surface 20r of the first wiring substrate 20 and the second main surface 30s of the second wiring substrate 30 are away from each other. Therefore, a gap (second lower region A2) is formed between the bottom surface 20r and the second main surface 30s.

In the optical detection device D2, the resin portion Af are disposed in the first lower region A1, the second lower region A2, and the intermediate region M1. Then, a part of the resin portion Af disposed in the intermediate region M1 in each of the optical detection units D, and a part of the resin portion Af disposed in the intermediate region M1 between optical detection units D adjacent to each other serve as the light shielding portion F. Therefore, as the resin portion Af, the light shielding portion F is integrally provided over the intermediate region M1, the first lower region A1, and the second lower region A2.

The optical detection device D2 described above includes the optical detection units D. Therefore, crosstalk between optical detection chips S1 can be minimized. In addition, crosstalk between optical detection chips S1 is also minimized between optical detection units D adjacent to each other.

Figure 19:
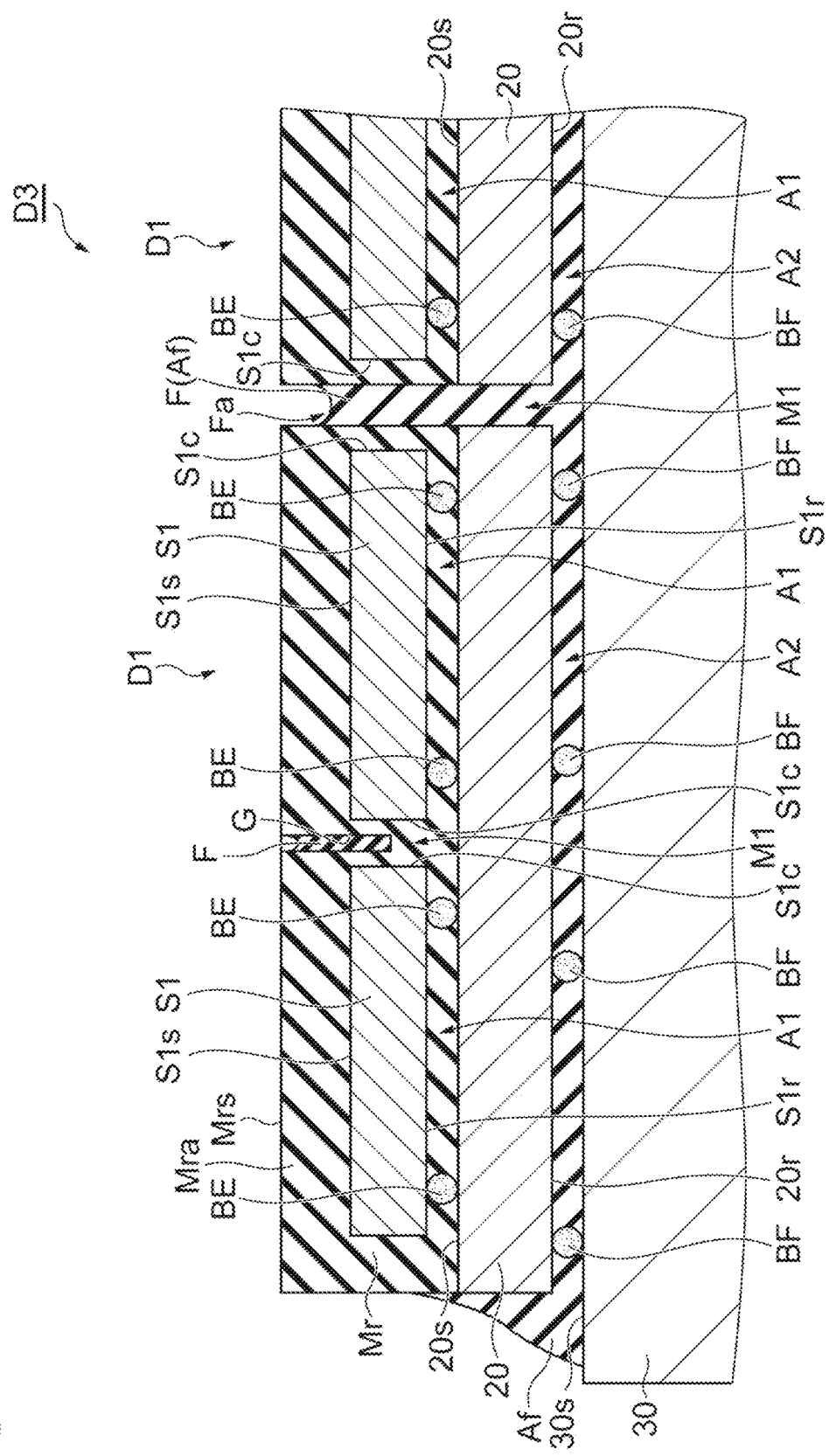
FIG. 19 is a schematic cross-sectional view of an optical detection device according to a modification example.

Subsequently, an optical detection device according to a modification example will be described. FIG. 19 is a schematic cross-sectional view of the optical detection device according to the modification example. In FIG. 19, the scintillator S3 is omitted. As illustrated in FIG. 19, an optical detection device D3 differs from the optical detection device D2 in including a plurality of optical detection units D1, in place of the plurality of optical detection units D.

When such an optical detection device D3 is manufactured, as illustrated in (a) of FIG. 20, the second lower region A2, the intermediate region M1, and the groove portion G are collectively filled with the underfill resin A. At this time, the coating apparatus DE is disposed on the intermediate region M1 between optical detection units D1, and the underfill resin A is disposed inside the intermediate region M1. Accordingly, due to a capillary phenomenon, the underfill resin A enters a space between each of the second lower region A2, the intermediate region M1, and the groove portion G (proceeds in the arrow direction in (b) of FIG. 20). In (a) of FIG. 20, hatching of the underfill resin A is omitted.

Here, as illustrated in FIG. 19, the groove portion G has a depth (dimensions in the first direction) greater than that of the position of the end portion Fa of the light shielding portion F in the intermediate region M1 between optical detection units D1 (positioned on the first main surface 20s side). That is, the bottom portion of the groove portion G is at a position deeper than the light receiving surface S1s, and the light shielding portion F is formed to be higher than the light receiving surface S1s (to be on the light incidence surface Mrs side). Accordingly, as illustrated in FIG. 20, the light shielding portion. F can be constituted by collectively filling the intermediate region M1 and the groove portion G with the underfill resin A.

The optical detection device D3 described above includes the optical detection units D1. Therefore, crosstalk between optical detection chips S1 can be minimized. In addition, crosstalk between optical detection chips S1 is also minimized between optical detection units D1 adjacent to each other.

The embodiment described above has described an embodiment for the optical detection unit, the optical detection device, and the method for manufacturing an optical detection unit according to the aspect of the present invention. Therefore, the optical detection unit, the optical detection device, and the method for manufacturing an optical detection unit according to the aspect of the present invention are not limited to those described above, and can be arbitrarily changed within a range not changing the gist of each of the claims.

For example, the light shielding portion F need only be provided in the intermediate region M1 at least on the light transmitting portion side of the light receiving surface S1s. That is, the light shielding portion F does not have to reach a location between the side surfaces S1c of the optical detection chip S1 and may extend to the first wiring substrate 20 beyond the location between the side surfaces S1c.

In addition, as the light shielding portion F, either a white resin or a black resin may be used. However, when considering both minimizing crosstalk and minimizing attenuation of the quantity of light, stray light is reflected by using a white resin. When crosstalk is to be reliably minimized, stray light can be absorbed by using a black resin.

Moreover, the capillary phenomenon at the time of the underfill resin A filling can be controlled by suitably adjusting dimensions of the gap, or viscosity of the underfill resin A, for example.

In description of the example of the method for manufacturing an optical detection unit D (the same in the optical detection unit D1), a step of providing the first bump electrode BE on the first main surface 20s of the first wiring substrate 20 is performed between the first step and the second step. However, for example, there are cases in which the first bump electrode BE is provided on the rear surface S1r of the optical detection chip S1 between the first step and the second step. In this case, between the first step and the second step, there is no need to provide the first bump electrode BE on the first main surface 20s of the first wiring substrate 20. In both cases, in the second step, while the first bump electrode BE is interposed between the rear surface S1r and the first main surface 20s, the plurality of optical detection chips S1 are disposed on the first main surface 20s.

INDUSTRIAL APPLICABILITY

It is possible to provide an optical detection unit, in which crosstalk between chips including a Geiger-mode APD can be minimized, an optical detection device, and a method for manufacturing an optical detection unit.

REFERENCE SIGNS LIST

20 First wiring substrate
20s First main surface
20r Bottom surface
30 Second wiring substrate
30s Second main surface
D, D1 Optical detection unit
D2, D3 Optical detection device
S1 Optical detection chip
S1s Light receiving surface
S1r Rear surface
S1c Side surface
S2 Glass member (light transmitting portion)
Mr Resin portion
Mra Resin portion (light transmitting portion)
BE First bump electrode
F Light shielding portion
Fa End portion
M1 Intermediate region A Underfill resin
A1 first lower region
A2 second lower region
G groove portion

The invention claimed is:
1. An optical detection unit comprising:
a first wiring substrate that has a first main surface;
a plurality of optical detection chips that each have a light receiving surface and a rear surface on a side opposite to the light receiving surface and are two-dimensionally arranged on the first main surface;
a first bump electrode that electrically connects the optical detection chip to the first wiring substrate;
light transmitting portions that are provided on the light receiving surfaces; and
a light shielding portion that has light reflection properties or light absorption properties,
wherein the optical detection chip includes a Geiger-mode APD and is mounted on the first wiring substrate by the first bump electrode in a state in which the rear surface faces the first main surface, and
wherein the light shielding portion is provided in an intermediate region positioned between the optical detection chips adjacent to each other when seen in a first direction intersecting the first main surface, and
wherein at least a part of the light shielding portion is provided in a region formed between the light transmitting portions which are arranged on the light receiving surfaces of the optical detection chips adjacent to each other.

2. The optical detection unit according to claim 1,
wherein each of the light transmitting portions includes a light incidence surface on a side opposite to a surface on the light receiving surface side, and
wherein an end portion of the light shielding is recessed toward the first main surface side.

3. The optical detection unit according to claim 1,
wherein each of the light transmitting portions is a glass member attached to the light receiving surface of each of the optical detection chips, and
wherein the light shielding portion is integrally provided over the intermediate region, and a first lower region between the first main surface and the rear surface.

4. The optical detection unit according to claim 1,
wherein each of the light transmitting portions is a part of a resin portion integrally sealing the plurality of optical detection chips,
wherein a groove portion positioned in the intermediate region is provided in the resin portion, and
wherein the light shielding portion is disposed inside the groove portion.

5. An optical detection device comprising:
the plurality of optical detection units according to claim 4;
a second wiring substrate that has a second main surface; and
a second bump electrode that electrically connects the optical detection units to the second wiring substrate,
wherein the optical detection units are arranged along the second main surface and are mounted on the second wiring substrate by the second bump electrode in a state in which a bottom surface of the first wiring substrate, on a side opposite to the first main surface of the first wiring substrate, faces the second main surface, and
wherein the light shielding portion is further provided at least on the light transmitting portion side of the light receiving surface in the intermediate region between the optical detection units adjacent to each other.

6. An optical detection device comprising:
the plurality of optical detection units according to claim 1;
a second wiring substrate that has a second main surface; and
a second bump electrode that electrically connects the optical detection units to the second wiring substrate,
wherein the optical detection units are arranged along the second main surface and are mounted on the second wiring substrate by the second bump electrode in a state in which a bottom surface of the first wiring substrate, on a side opposite to the first main surface of the first wiring substrate, faces the second main surface, and
wherein the light shielding portion is integrally provided over the intermediate region, a first lower region between the first main surface and the rear surface, and a second lower region between the second main surface and the bottom surface of the first wiring substrate.

7. A method for manufacturing an optical detection unit, the method comprising:
a first step of preparing a first wiring substrate having a first main surface, and a plurality of optical detection chips having a light receiving surface and a rear surface on a side opposite to the light receiving surface;
a second step of disposing the plurality of optical detection chips on the first main surface such that the rear surfaces face the first main surface and are two-dimensionally arranged on the first main surface while a first bump electrode is interposed between the rear surface and the first main surface;
a third step of mounting the plurality of optical detection chips on the first main surface by a reflow of the first bump electrode; and
a fourth step of filling an intermediate region positioned between the optical detection chips adjacent to each other when seen in a first direction intersecting the first main surface, and a first lower region between the first main surface and the rear surface, with an underfill resin,
wherein the optical detection chip includes a Geiger-mode APD,
wherein a light transmitting portion is provided on the light receiving surface of each of the optical detection chips,
wherein the underfill resin has light reflection properties or light absorption properties, and
wherein in the fourth step, a light shielding portion is constituted by filling the intermediate region with the underfill resin at least to the light transmitting portion side of the light receiving surface.

8. A method for manufacturing an optical detection unit, the method comprising:
a first step of preparing a first wiring substrate having a first main surface, and a plurality of optical detection chips having a light receiving surface and a rear surface on a side opposite to the light receiving surface;
a second step of disposing the plurality of optical detection chips on the first main surface such that the rear surfaces face the first main surface and are two-dimensionally arranged on the first main surface while a first bump electrode is interposed between the rear surface and the first main surface;
a third step of mounting the plurality of optical detection chips on the first main surface by a reflow of the first bump electrode;

a fourth step of constituting a resin portion which integrally seals the plurality of optical detection chips with a mold resin having optical transparency to constitute a light transmitting portion which is a part of the resin portion over a plurality of light receiving surfaces;

a fifth step of forming a groove portion in the resin portion to be positioned in an intermediate region positioned between the optical detection chips adjacent to each other when seen in a first direction intersecting the first main surface; and a sixth step of constituting a light shielding portion by filling an inside of the groove portion with a resin having light reflection properties or light absorption properties, wherein the optical detection chip includes a Geiger-mode APD, and wherein in the fifth step, the groove portion is formed at least on the light transmitting portion side of the light receiving surface in the intermediate region.

* * * * *